(12) United States Patent
Kohl et al.

(10) Patent No.: US 8,169,065 B2
(45) Date of Patent: May 1, 2012

(54) STACKABLE CIRCUIT STRUCTURES AND METHODS OF FABRICATION THEREOF

(75) Inventors: James E. Kohl, Reading, MA (US); Charles W. Eichelberger, Wakefield, MA (US)

(73) Assignee: EPIC Technologies, Inc., Woburn, MA (US)

( * ) Notice: Subject to any disclaimer, the term of this patent is extended or adjusted under 35 U.S.C. 154(b) by 126 days.

(21) Appl. No.: 12/644,380

(22) Filed: Dec. 22, 2009

(65) Prior Publication Data

US 2011/0147911 A1 Jun. 23, 2011

(51) Int. Cl.
*H01L 23/48* (2006.01)
*H01L 21/30* (2006.01)

(52) U.S. Cl. ........ 257/686; 257/734; 257/777; 257/782; 257/786; 257/E23.141; 257/E25.006; 257/E25.013

(58) Field of Classification Search .................. 257/686, 257/734, 777, 782, 786, E23.141, E25.013, 257/E25.006
See application file for complete search history.

(56) References Cited

U.S. PATENT DOCUMENTS

| | | |
|---|---|---|
| 4,640,010 A | 2/1987 | Brown |
| 4,783,695 A | 11/1988 | Eichelberger et al. |
| 5,111,278 A | 5/1992 | Eichelberger |
| 5,250,843 A | 10/1993 | Eichelberger |
| 5,353,498 A | 10/1994 | Fillion et al. |
| 5,841,193 A | 11/1998 | Eichelberger |
| 5,894,410 A | 4/1999 | Barrow |
| 5,959,356 A | 9/1999 | Oh |
| 5,998,859 A | 12/1999 | Griswold et al. |
| 6,064,114 A | 5/2000 | Higgins, III |
| 6,075,700 A | 6/2000 | Houghton et al. |
| 6,104,610 A | 8/2000 | Tilton et al. |
| 6,159,767 A * | 12/2000 | Eichelberger ................. 438/107 |

(Continued)

FOREIGN PATENT DOCUMENTS

JP 2005-109306 A 4/2005

OTHER PUBLICATIONS

Kohl et al., "Low Cost Chip Scale Packaging and Interconnect Technology", Proceedings of the Surface Mount International Conference, San Jose, California (Sep. 1997).

(Continued)

*Primary Examiner* — Eugene Lee
*Assistant Examiner* — Peniel M Gumedzoe
(74) *Attorney, Agent, or Firm* — Kevin P. Radigan, Esq.; Heslin Rothenberg Farley & Mesiti P.C.

(57) ABSTRACT

Stackable circuit structures and methods of fabrication are provided employing first level metallization directly on a chips-first layer(s), which includes: a chip(s), each with a pad mask over its upper surface and openings exposing its contact pads; electrically conductive structures; and structural dielectric material surrounding the side surfaces of the chips and the conductive structures. Each chips-first layer further includes a metallization layer on the front surface of the layer, residing at least partially on the pad mask and extending over an edge of the chip. Together, the pad mask and the structural material electrically isolate the metallization layer from the chip. Input/output interconnect structures physically and electrically contact the metallization layer over the front surface and/or the lower surfaces of the electrically conductive structures at the back surface of the chips-first layer, to facilitate input/output connection to chips of the layers in a stack.

17 Claims, 17 Drawing Sheets

U.S. PATENT DOCUMENTS

| | | | |
|---|---|---|---|
| 6,396,148 | B1 | 5/2002 | Eichelberger et al. |
| 6,426,545 | B1 | 7/2002 | Eichelberger et al. |
| 6,507,115 | B1 | 1/2003 | Hofstee et al. |
| 6,555,908 | B1 | 4/2003 | Eichelberger et al. |
| 6,586,827 | B2 | 7/2003 | Takeuchi et al. |
| 6,818,544 | B2 | 11/2004 | Eichelberger et al. |
| 6,836,002 | B2 | 12/2004 | Chikawa et al. |
| 6,838,776 | B2 | 1/2005 | Leal et al. |
| 6,972,964 | B2 | 12/2005 | Ho et al. |
| 7,006,359 | B2 | 2/2006 | Galvagni et al. |
| 7,015,577 | B2 | 3/2006 | Wang |
| 7,112,467 | B2 | 9/2006 | Eichelberger et al. |
| 7,122,467 | B2 | 10/2006 | Lee et al. |
| 7,238,602 | B2 | 7/2007 | Yang |
| 7,339,279 | B2 | 3/2008 | Yang |
| 7,345,365 | B2 | 3/2008 | Lee et al. |
| 7,405,102 | B2 | 7/2008 | Lee et al. |
| 7,427,812 | B2 | 9/2008 | Wakisaka et al. |
| 7,429,793 | B2 | 9/2008 | Yamagata |
| 7,550,830 | B2 | 6/2009 | Yoon |
| 7,550,833 | B2 | 6/2009 | Mihara |
| 7,572,681 | B1 | 8/2009 | Huemoeller et al. |
| 7,619,901 | B2 | 11/2009 | Eichelberger et al. |
| 2002/0038908 | A1 | 4/2002 | Ding et al. |
| 2003/0197285 | A1 | 10/2003 | Strandberg et al. |
| 2003/0201534 | A1 | 10/2003 | Eichelberger et al. |
| 2004/0178495 | A1* | 9/2004 | Yean et al. .................. 257/723 |
| 2005/0062147 | A1 | 3/2005 | Wakisaka et al. |
| 2005/0161799 | A1 | 7/2005 | Jobetto |
| 2006/0017155 | A1 | 1/2006 | Wang |
| 2007/0096306 | A1* | 5/2007 | Yamagata .................. 257/734 |
| 2007/0249102 | A1 | 10/2007 | Brunnbauer et al. |
| 2008/0135977 | A1* | 6/2008 | Meyer et al. .................. 257/531 |
| 2008/0315375 | A1 | 12/2008 | Eichelberger et al. |
| 2008/0315377 | A1 | 12/2008 | Eichelberger et al. |
| 2008/0315391 | A1 | 12/2008 | Kohl et al. |
| 2008/0315404 | A1 | 12/2008 | Eichelberger et al. |
| 2008/0316714 | A1 | 12/2008 | Eichelberger et al. |
| 2010/0031500 | A1 | 2/2010 | Eichelberger et al. |
| 2010/0032091 | A1 | 2/2010 | Eichelberger et al. |
| 2010/0035384 | A1 | 2/2010 | Eichelberger et al. |
| 2010/0044855 | A1 | 2/2010 | Eichelberger et al. |
| 2010/0047970 | A1 | 2/2010 | Eichelberger et al. |

OTHER PUBLICATIONS

Eichelberger et al., "Method of Fabricating a Base Layer Circuit Structure", U.S. Appl. No. 12/580,509, filed Oct. 16, 2009.

Eichelberger et al., "Method of Bonding Two Structures Together With an Adhesive Line of Controlled Thickness", U.S. Appl. No. 12/580,526, filed Oct. 16, 2009.

Eichelberger et al., "Method of Fabricating a Circuit Structure With a Strengthening Structure Over the Back Surface of a Chip Layer", U.S. Appl. No. 12/580,537, filed Oct. 16, 2009.

Eichelberger et al., "Integrated Thermal Structures and Fabrication Methods Thereof Facilitating Implementing a Cell Phone or Other Electronic System", U.S. Appl. No. 12/611,405, filed Nov. 3, 2009.

Eichelberger et al., "Integrated Conductive Structures and Fabrication Methods Thereof and Facilitating Implementing a Cell Phone or Other Electronic System", U.S. Appl. No. 12/611,412, filed Nov. 3, 2009.

Office Action for U.S. Appl. No. 12/144,717 (U.S. Patent Publication No. 2008/0315404 A1), dated Jan. 8, 2010.

Office Action for U.S. Appl. No. 12/144,720 (U.S. Patent Publication No. 2008/0315375 A1), dated Apr. 29, 2010.

Office Action for U.S. Appl. No. 12/144,720 (U.S. Patent Publication No. 2008/0315375 A1), dated Nov. 19, 2009.

Office Action for U.S. Appl. No. 12/144,725 (U.S. Patent Publication No. 2008/0315377 A1), dated Mar. 17, 2010.

Office Action for U.S. Appl. No. 12/144,840 (U.S. Patent Publication No. 2008/0315391 A1), dated Jul. 6, 2010.

"Wire Bond and Beyond: Semiconductor Packaging Innovation", White Paper, Freescale Semiconductor, Inc. Jul. 2006, pp. 1-9.

Leung, J., "Packaging Technology for Mobile Platforms", Wireless and Mobile Systems Group, Freescale Semiconductor, Inc., printed from Internet on Nov. 18, 2006, pp. 1-28.

Mangrum, M., "Packaging Technologies for Mobile Platforms", Wireless Mobile Systems Group, Freescale Semiconductor, Inc., Sep. 28, 2006, pp. 1-19.

"Redistributed Chip Package (RCP) Technology", Freescale Semiconductor, Inc., printed from Internet on Nov. 18, 2006, pp. 1-6.

Keser, B., "Birds-of-a-Feather: Redistributed Chip Package (RCP) Broad-Range Applications for an Innovative Package Technology", Freescale Semiconductor, Inc., Jun. 2007, pp. 1-18.

Keser, B., "Redistributed Chip Packaging", http://www.semiconductor.net/index.asp?layout=articlePrint&articleID=CA6428421, Semiconductor International, Apr. 1, 2007, pp. 1-5.

Final Office Action for U.S. Appl. No. 12/144,750 (US Application Publication No. 2008/0315375 A1) dated Nov. 8, 2011.

Office Action for U.S. Appl. No. 12/611,405 (US Application Publication No. 2010/0044855 A1) dated Nov. 10, 2011.

* cited by examiner

STACKABLE CIRCUIT STRUCTURES AND METHODS OF FABRICATION THEREOF

TECHNICAL FIELD

This invention relates in general to circuit structures and methods of fabrication thereof, and more particularly, to stackable (and stacked) chips-first circuit structures and methods of fabrication thereof.

BACKGROUND OF THE INVENTION

The conventional approach to electronic packaging and interconnect has been to package individual integrated circuit (IC) chips into a single package and to attach these packages to a printed circuit board to provide interconnect between the individual IC chips. In recent years, this approach has met with problems of speed, size and interconnect density due to ever-constant demands for reduced size and increased performance from such integrated circuit packages.

Process speed is conventionally limited by the fact that individual packages have loading capacitance and inductance associated with their relatively long pins and by the large size of conductor runs in the packages relative to the size of the conductors of a bare IC chip. As the speed of computers and other devices continues to increase, the problem of providing electronic packaging and interconnect which provides maximum performance has become a significant challenge. One solution to the problem is the multichip module (MCM). In an MCM, bare (unpackaged) IC chips are interconnected by means of a miniature printed circuit board whose interconnect pitch may match the pitch of the IC chips themselves. There are presently two main classes of MCM. These are the chips-last MCM and the chips-first MCM. In the chips-last MCM, the miniature circuit board is fabricated first and then the bare IC chips are attached and interconnected to the circuit board. The method of interconnect is usually wire-bond or solder bump. In the chips-first MCM, the chips are placed first relative to each other and a miniature circuit board is then built above the chips.

Structures in accordance with the present invention fall into the category of chips-first MCMs. Chips-first MCMs provide one way to minimize the size of a multichip module and provide high performance interconnect. Examples of chips-first modules are given in U.S. Pat. Nos. 5,250,843; 5,353,498; and 5,841,193, each of which is hereby incorporated herein by reference in its entirety.

In a chips-first circuit structure, the front surface of the chip layer is conventionally covered by a dielectric layer, which is patterned with via holes exposing contact pads on the upper surfaces of the chips of the chip layer. A metallization is then applied and patterned to make electrical contact to the contact pads and form the interconnect. As a further step, a solder mask may be provided above the dielectric layer with openings to expose the metallization layer, and solder bumps added to provide an electrical interconnect means for connecting the electronic module to, for example, a printed circuit board. In all cases, the dielectric layer is utilized over the chips-first circuit structure, with multiple via openings to the chips' contact pads.

One problem with this approach is that a tight pad pitch can be difficult to connect to when employing a dielectric layer with multiple via openings to interconnect the chips of the chips-first layer. This is because the dielectric layer is relatively thick, and the resolution ability of the dielectric may prevent making the desired via hole pitch. Also, any resist that is used to pattern the metallization layer must also fill the via hole. This increases the effective thickness of the resist, and makes patterning the metal layer more difficult than if the whole assembly was essentially planar.

Another problem with the above-described chips-first interconnect approach is that lithography steps in the process are among the most expensive to perform, and have the greatest impact on process yield. In high volume packaging, fewer lithography steps translates directly into lower cost. In the existing approach, the first interconnect layer is formed by patterning individual via holes in the dielectric layer, and then patterning the metallization. Each of these patterning steps requires at least one lithography step.

SUMMARY OF THE INVENTION

Briefly summarized, the present invention comprises, in one aspect, a circuit structure which includes: at least one chips-first layer, each chips-first layer including: at least one chip, each chip comprising at least one side surface, an upper surface, a lower surface, and at least one contact pad at the upper surface, and a pad mask over the upper surface with at least one opening therein exposing the at least one contact pad at the upper surface; at least one electrically conductive structure comprising at least one side surface, an upper surface and a lower surface; a structural material surrounding the at least one side surface of each chip of the at least one chip of the chips-first layer and surrounding the at least one side surface of each electrically conductive structure of the at least one electrically conductive structure, the structural material having an upper surface substantially coplanar with or parallel to at least one of the upper surface of the at least one chip or the upper surface of the at least one electrically conductive structure, and defining at least a portion of a front surface of the chips-first layer, and a lower surface substantially coplanar with or parallel to at least one of the lower surface of the at least one chip or the lower surface of the at least one electrically conductive structure, and defining at least a portion of a back surface of the chips-first layer, and wherein the structural material comprises a dielectric material; and a metallization layer at the front surface of the chips-first layer, the metallization layer residing at least partially on the upper surface of the structural material and at least partially on the pad mask of the at least one chip, and extending over at least one edge of the at least one chip, and wherein the metallization layer electrically connects the at least one contact pad on the upper surface of the at least one chip to the at least one electrically conductive structure, and the structural material and the pad mask over the upper surface of the at least one chip electrically isolate the metallization layer from the at least one edge of the at least one chip; and wherein the circuit structure further comprises at least one input/output interconnect structure disposed over the back surface(s) of the at least one chips-first layer, the at least one input/output interconnect structure physically and electrically contacting the lower surface of at least one electrically conductive structure and facilitating electrical connection from the back surface of the at least one chips-first layer to the metallization layer at the front surface of the at least one chips-first layer.

In another aspect, the invention comprises a circuit structure which includes: a stack of multiple chips-first layers, each chips-first layer in the stack of multiple chips-first layers including: at least one chip, each chip comprising at least one side surface, an upper surface, a lower surface, and at least one contact pad at the upper surface, and a pad mask over the upper surface with at least one opening therein exposing the at least one contact pad at the upper surface; at least one electrically conductive structure comprising at least one side surface, an upper surface, and a lower surface; a structural material surrounding the at least one side surface of each chip of the at least one chip of the chips-first layer and surrounding the at least one side surface of each electrically conductive structure of the at least one electrically conductive structure of the chips-first layer, the structural material having an upper surface substantially coplanar with or parallel to at least one of the upper surface of the at least one chip or the upper surface of the at least one electrically conductive structure, and defining at least a portion of a front surface of the chips-first layer, and a lower surface substantially coplanar with or parallel to at least one of the lower surface of the at least one chip or the lower surface of the at least one electrically conductive structure, and defining at least a portion of a back surface of the chips-first layer, wherein the structural material comprises a dielectric material; a metallization layer residing at least partially on the upper surface of the structural material and at least partially on the pad mask of the at least one chip, and extending over at least one edge of the least one chip, and wherein the metallization layer electrically connects the at least one contact pad on the upper surface of the at least one chip to the at least one electrically conductive structure, and the structural material and the pad mask over the upper surface of the at least one chip electrically isolate the metallization layer from the at least one edge of the at least one chip; and wherein the circuit structure further comprises a plurality of input/output interconnect structures comprising input/output interconnect structures electrically connecting together a first chips-first layer and a second chips-first layer of the stack of multiple chips-first layers, wherein the input/output interconnect structures are disposed between and electrically interconnect at least one of the lower surface of an electrically conductive structure of the first chips-first layer and the metallization layer of the second chips-first layer, or the metallization layer of the first chips-first layer and the metallization layer of the second chips-first layer, or the lower surface of an electrically conductive structure of the first chips-first layer and the lower surface of an electrically conductive structure of the second chips-first layer.

Methods of fabricating, and of facilitating fabricating, the above-summarized circuit structures are also described and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1A:
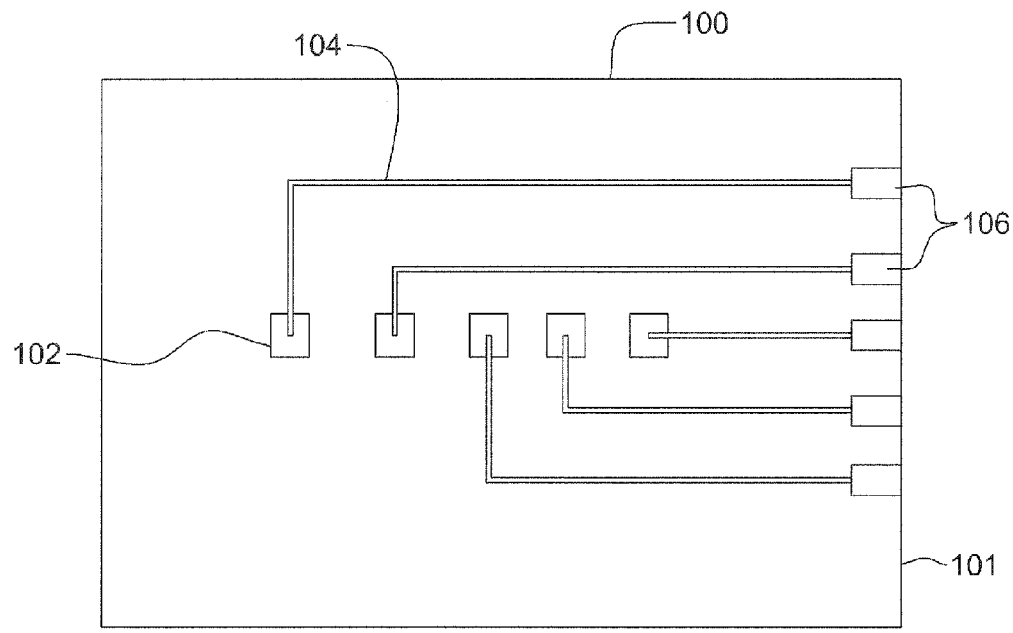
FIG. 1A is a plan view of one embodiment of a conventional integrated circuit chip with contact pads and redistribution pads (along the edge of the chip) shown interconnected by a redistribution metallization disposed over a dielectric layer.

Generally stated, provided herein are numerous enhancements to multichip modules, and in particular, to chips-first circuit structures. Advantageously, described herein in one aspect are structures and fabrication methods for a chips-first circuit structure, or electronic module, wherein a first level metallization is applied directly to the front surface of the chips-first layer, without first applying a dielectric layer over the chips-first layer. Further, provided herein are structures and methods of fabrication which provide a chips-first circuit structure with a fan-out metallization from the chip pads, where lithography steps are minimized, and only one lithography step is used for the fan-out metallization. The structures and methods of fabrication described herein provide interconnect to a tight pad pitch, such as associated with today's integrated circuit chips, without the propensity for shorting to adjacent pads. This is accomplished by using (for example) the existing pad masks of bare integrated circuit chips, as well as the surrounding structural material of the chips-first layer, to prevent shorting to adjacent pads, or to the chip edge, and to isolate other components of the chip as described herein. The circuit structures and methods of fabrication described below are single chip or multichip, chips-first circuit structures.

Advantageously, the chips-first structures disclosed herein can be readily assembled into a stack of interconnected chips-first layers. As one example, each chips-first layer might comprise one or more memory chips, with a stack comprising an interconnected array of memory chips. Another advantage of the structures disclosed herein is that a minimum number of interconnection layers are utilized (or required) to produce the stack, thereby minimizing processing complexity and costs. Additionally, a stack structure and chip interconnect method are disclosed below which do not require use of wirebonding. The chips-first structures disclosed have a minimum thickness per stack element or layer, so that a maximum number of elements (i.e., layers) may be stacked within a given vertical space. Additionally, costly serial wirebonding processes are eliminated by employing an interconnect bonding approach in which a large number of interconnect structures (and, subsequently bonds) are formed at a single time in a manner that is low cost and high yield.

In various embodiments, a stacked chips-first structure or module is attained without the use of a printed circuit board substrate for the completed module. Advantageously, the individual chips in the chips-first layers of a stack may be fully tested before being incorporated into the stack, thereby improving yield of the resultant stack.

As noted, disclosed herein are methods of fabrication and circuit structures (or electronic modules) employing chips-first layers with input/output interconnect structures optimized for stacking. These chips-first structures facilitate efficient stacking by providing a simple structure with a minimum number of interconnect layers. By minimizing the number of interconnect layers, the overall thickness of each chips-first layer plus interconnect is decreased, thereby decreasing the total thickness of the stack. The structure produced does not require a dielectric layer and via holes on either the top or bottom of the structure or the layers within the structure, as is the case with conventional chips-first modules, such as described above. Rather, the first layer of the fan-out metallization of each chips-first layer is prevented from shorting to the chip(s) by a combination of the pad mask on the chip and the structural material (i.e., filler/encapsulant) surrounding the chip(s). The pad mask is assumed to be part of the chip as manufactured, while the structural material is configured so that the metallization over the front surface of the chips-first layer will not short to an edge of the underlying chip.

Figure 1B:
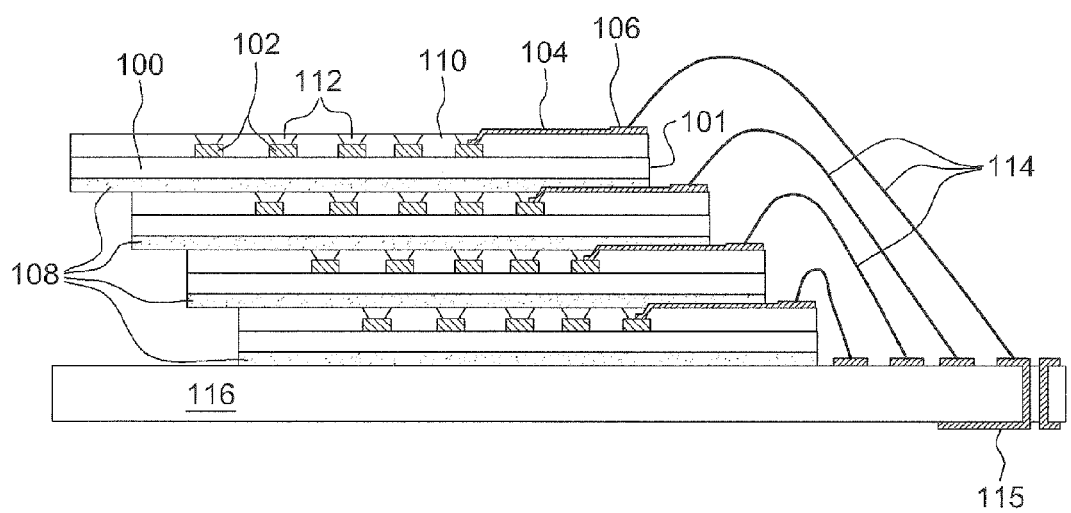
FIG. 1B is a cross-sectional elevational view of one embodiment of a stack of the conventional integrated circuit chips of FIG. 1A, shown separated by adhesive spacers and wirebonded from the redistribution pads along the edges of the chips to a printed circuit board substrate.

The present invention relates in part to stacking and to interconnecting multiple integrated circuit chips, and facilitates a reduction in the size and volume of a resultant multi-chip stack package. Many portable devices, such as cell phones and solid state memory sticks, routinely use stacks of memory chips interconnected to each other and to the pads of the package to make a compact structure. A typical prior art structure is illustrated in FIGS. 1A & 1B. A first step in fabricating this stack is to redistribute the contact pads 102 of each integrated circuit chip 100 to an edge 101 of the chip. In many memory devices, the natural location for the pads of the device are at the center of the device. In other types of memory chips, the pads are located along the periphery of the device. In either case, the redistribution layer comprises a dielectric 110 with via holes 112 and a redistribution metallization 104 that electrically connects the original contact pads 102 to redistribution pads 106 at the edge 101 of the integrated circuit chip 100.

Individual chips are stacked in an offset fashion as illustrated in FIG. 1B, and separated from one another by an adhesive spacer 108. The offset exposes the redistribution pads 106 at the edges 101 of the chips 100 so they may be wirebonded 114 to metallization of a printed circuit board 116, which serves as the carrier substrate and provides interconnects 115 to outside the package. When wirebonding is complete, the stack and substrate are encapsulated in a molding compound (not shown) to provide a finished package. There are several drawbacks to this approach. For example, the wirebonding pattern is complex, and adding to the complexity, the wirebonds must be low profile in order to minimize the thickness of the resultant package. Further, as the number of chips in the stack increases, the area on the circuit board must increase to accommodate the added number of wirebonds. Also, a wirebond is required for each I/O contact on each chip and every wirebond must be individually made and run in a low profile arrangement. This process affects the cost since the yield of special low profile wirebonds is less than 100%, and while wirebonding equipment has continually improved in speed, there is still significant time required for making such a large number of wirebonds. In addition, there has historically been a problem with completing testing of integrated circuit chips while they are in wafer form. A single, incompletely tested integrated circuit chip that turns out to be defective means that an entire stack of chips incorporating that chip is defective.

Figure 2A:
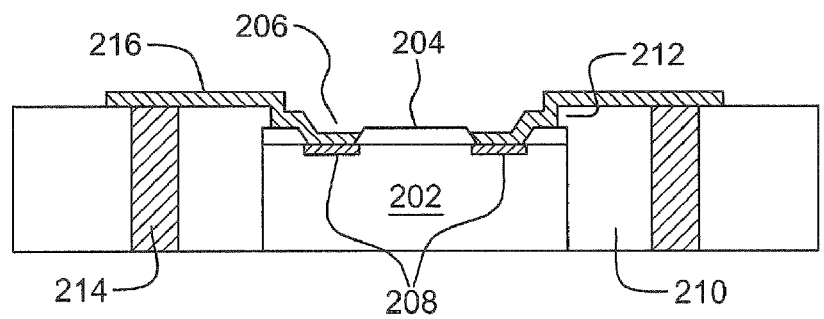
FIG. 2A is a cross-sectional elevational view of one embodiment of a chips-first circuit structure comprising a metallization layer exposed directly on the pad mask and the structural material surrounding the chip(s) and the electrically conductive structure(s), in accordance with an aspect of the present invention.
Figure 2B:
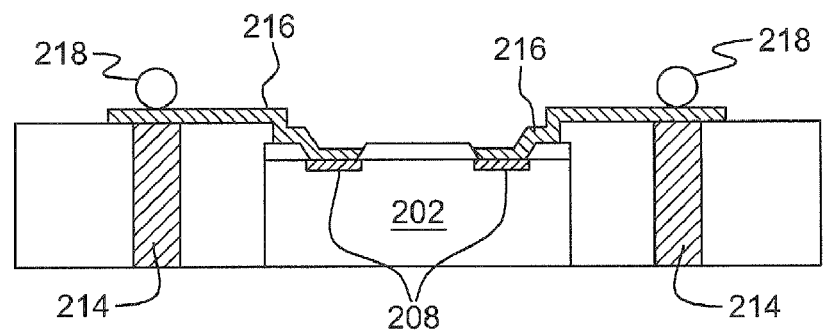
FIG. 2B is a cross-sectional elevational view of the chips-first circuit structure of FIG. 2A after provision of input/output interconnect structures over the front surface of the chips-first layer in direct physical and electrical contact with the metallization layer thereof, in accordance with an aspect of the present invention.
Figure 2C:
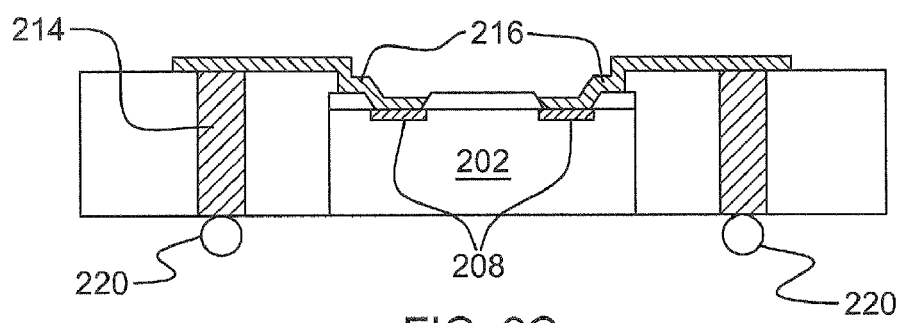
FIG. 2C is a cross-sectional elevational view of the chips-first circuit structure of FIG. 2A, after provision of input/output interconnect structures over the back surface of the chips-first layer in direct physical and electrical contact with the lower surfaces of the electrically conductive structures extending through the chips-first layer, in accordance with an aspect of the present invention.

FIGS. 2A-2C illustrate, by way example, cross-sectional views of chips-first circuit structures (or modules), in accordance with aspects of the present invention. The circuit structures of FIGS. 2B & 2C illustrate the structure of FIG. 2A, but with different input/output interconnect structures shown.

Referring first to FIG. 2A, a basic chips-first structure is illustrated. This structure includes one or more integrated circuit chips 202, each with a pad mask 204 disposed over the upper surface thereof, and with via openings 206 that expose respective contact pads 208. Structural material (e.g., filler/encapsulant) 210 surrounds and contacts the side surfaces of the integrated circuit chip(s) 202 (and, as described below, the one or more electrically conductive structures of the chips-first structure). The structural material is configured such that the edges of the chip are electrically and mechanically protected so that a metallization 216 over the top thereof will not short to the chip edge(s) or fracture due to any roughness in the chip edge(s). In one embodiment, a portion 212 of the structural material 210 overlies a portion of the pad mask 204, to assist in electrically isolating the chip edge(s) and the electrical structures of the chip(s).

As noted, the chips-first circuit structure further comprises multiple electrically conductive structures 214, the side surfaces of which are also surrounded and physically contacted by structural material 210. Electrically conductive structures 214 provide electrical connection between the front surface and the back surface of the chips-first layer. Patterned metallization 216 makes electrical contact to the exposed contact pads and provides (in one embodiment) connection from the exposed contact pads to the electrically conductive structures 214. In one implementation, electrically conductive structures 214 are disposed proximate to the integrated circuit chip(s) 202 and facilitate input/output connection to the chip(s). Metallization layer 216 is prevented from shorting to the top and edge(s) of the chip(s) 202 by pad mask 204 on the top surface of the chip(s), as well as the structural material 210 physically contacting the edge of the chip, in one embodiment, partially overlying 212 the pad mask 204, as illustrated in FIG. 2A-2C.

FIGS. 2B & 2C illustrate the chips-first circuit structure of FIG. 2A further provided with input/output (I/O) bumps, posts or studs (generally referred to herein as I/O interconnect structures), positioned (for example) depending upon the desired interconnect approach to be used for interconnecting the chips-first layer in a stack of multiple chips-first layers. FIG. 2B illustrates the basic chips-first layer of FIG. 2A, with I/O interconnect structures 218 in direct physical and electrical contact with the metallization layer 216 on the front surface of the chips-first layer, that is, on the same side of the layer as the contact pads 208 of the chip(s) 202 (and disposed, for example, over the electrically conductive structures 214), while FIG. 2C illustrates the chips-first structure of FIG. 2A, with I/O interconnect structures 220 at the lower surface of the chips-first layer, that is, on the opposite side of the layer form the side comprising the contact pads 208 of the chip(s) 202, and in direct physical and electrical contact with the lower surfaces of the electrically conductive structures 214. There are numerous unique aspects to these structures.

For example, there is no first level dielectric layer on the upper surface of the chip layer, that is, over the integrated circuit chip(s) and structural material. As detailed in co-pending, commonly assigned U.S. Patent Publication No. 2008/0315391 A1, the entirety of which is hereby incorporated herein by reference, prior art chips-first structures traditionally have required a dielectric layer with individual via holes above the chip pads to provide dielectric insulation for subsequent metallization extending beyond the edge of the integrated circuit chip. Further, in accordance with the structures of FIGS. 2A-2C, there is no requirement for patterned dielectric layer(s) or redistribution metallization pattern(s) on the back surfaces of the chips-first layers. This reduces complexity of the resultant module, as well as reducing overall thickness of the module. The overall thickness of the module is of significant importance in space constrained devices, such as cell phones and other portable equipment. For example, the need for memory in portable devices is constantly increasing, requiring ever more memory chips in the device. At the same time, there is pressure to make the thickness of the device as thin as possible for convenience in carrying the electronic device. For these reasons, it is advantageous to provide an approach for stacking chips which results in a stack that is as thin as possible, in addition to reducing the number of processing steps required for fabricating the stacked structures.

FIGS. 3A-3K illustrate methods for fabricating circuit structures (or electronic modules), in accordance with aspects of the present invention.

Figure 3A:
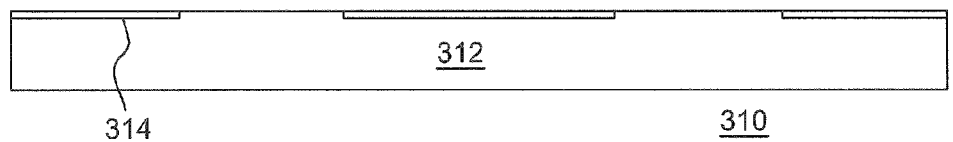
FIG. 3A is a cross-sectional elevational view of a glass alignment plate with a UV-opaque mask pattern employed in fabricating a circuit structure, in accordance with an aspect of the present invention.

Referring first to FIG. 3A, in one fabrication approach, an alignment plate 310 is utilized. Details on the use of an alignment plate are provided in commonly assigned U.S. Pat. No. 7,122,467 B2, and U.S. Pat. No. 7,619,901, each of which is hereby incorporated herein by reference in its entirety. As illustrated in FIG. 3A, alignment plate 310 includes, in one embodiment, a glass plate 312 and a UV-opaque mask pattern 314 on one side thereof. The glass plate and mask are reusable, with the formation of the UV-opaque mask pattern being known in the art for making so-called glass masks used in semiconductor and other lithographic processing.

Figure 3B:
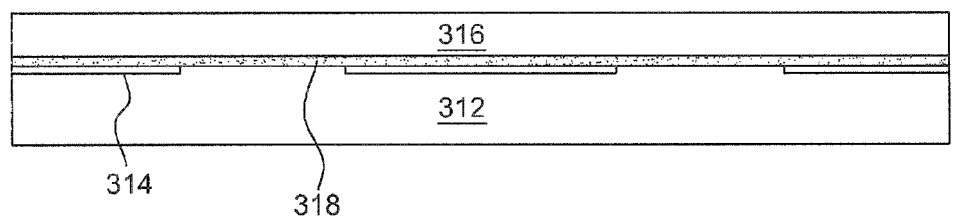
FIG. 3B is a cross-sectional elevational view of the structure of FIG. 3A, after disposition of a UV-release adhesive and a polyester film over the glass plate, in accordance with an aspect of the present invention.

In FIG. 3B, a polyester film 316 coated with a UV-release adhesive 318 has been bonded to the side of glass plate 312 with UV-opaque mask pattern 314. As one example, UV-release film 318 is an Adwill D218 film available from Lintec of Tokyo, Japan. Before continuing, the release film can be exposed to UV light to reduce the adhesion of the film. Although exposure of the tape is normally intended to release the tape, the residual adhesion is not zero and is sufficient for the subsequent processing steps described herein. Further, the cured tape can undergo relatively high temperature processing without the release adhesive bubbling under the polyester film.

At this point, a pattern of metallization (FIG. 3C) is provided on polyester film 316. The purpose of this metallization is to provide electrically conductive structures 324 in the encapsulant (i.e., filler material (see FIG. 3F)) for establishing, for example, through connects. Details of the application of metal and fabrication of these structures are provided in the above-incorporated, commonly-assigned U.S. Pat. No. 7,619,901. The illustrated pattern is used to form through connects through the subsequently formed structural material (i.e., encapsulant/filler), as described below.

Figure 3C:
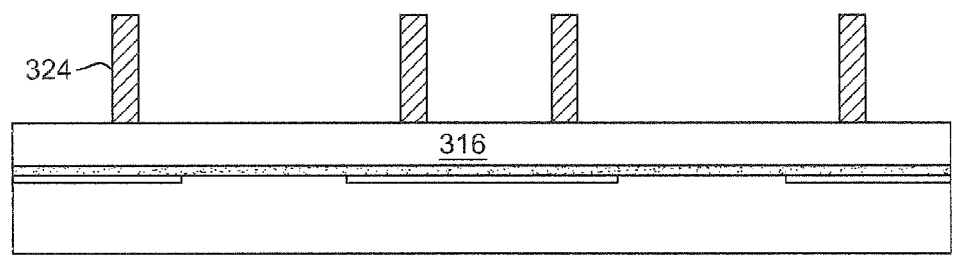
FIG. 3C is a cross-sectional elevational view of the structure of FIG. 3B, after formation of electrically conductive structures over the polyester film, in accordance with an aspect of the present invention.
Figure 3D:
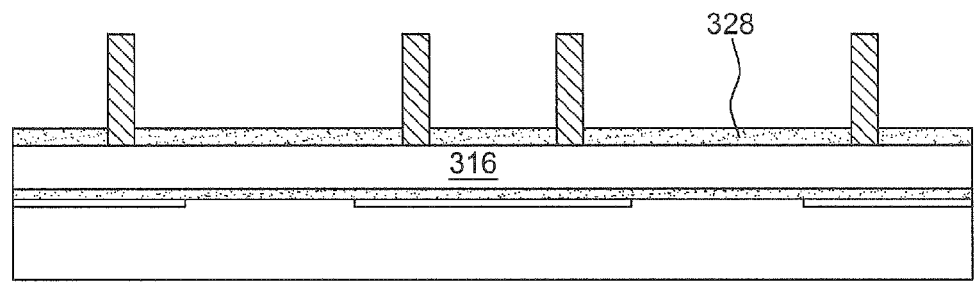
FIG. 3D is a cross-sectional elevational view of the structure of FIG. 3C, after disposition of a UV-curable chip attach adhesive over the polyester film, in accordance with an aspect of the present invention.

Referring to FIG. 3D, a chip attach adhesive 328 is next applied to the exposed side of the UV-release tape, that is, to the exposed side of polyester film 316. This adhesive is, in one embodiment, an adhesive that can be cured by UV light. Details on using UV-release tape and UV-curable adhesive are provided in the above-incorporated U.S. Pat. No. 7,112,467 B2. The adhesive can be spray coated onto the UV release film and dried of solvent at 50-75° C. for a period of 30 minutes in a forced hot air oven. By way of specific example, thickness of the UV-curable chip attach adhesive might be 3 to 6 microns.

Figure 3E:
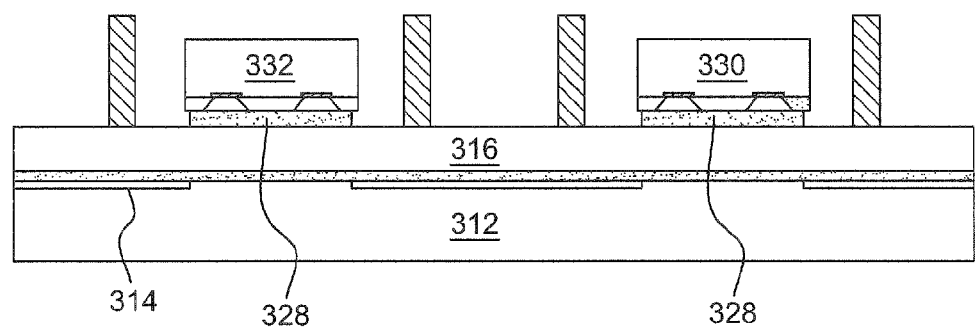
FIG. 3E is a cross-sectional elevational view of the structure of FIG. 3D, after placement of multiple chips onto the UV-curable chip attach adhesive, curing of the adhesive, and plasma etching of the resultant structure to remove uncured chip attach adhesive, in accordance with an aspect of the present invention.

Referring to FIG. 3E, chips 330 and 332 are next placed face down into the UV curable adhesive 328 on polyester film 316. Note that the masking pattern 314 openings align with the placement of the chips. To facilitate chip placements, the masking pattern can have features, not shown, that aid pick and place equipment in accurately placing the chips.

Figure 3F:
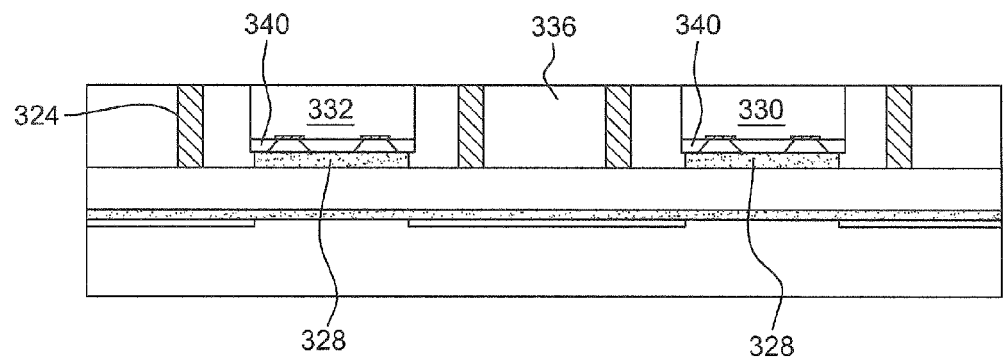
FIG. 3F is a cross-sectional elevational view of the structure of FIG. 3E, after disposition of a structural material over the polyester film and surrounding the chips and the electrically conductive structures, in accordance with an aspect of the present invention.

The UV-curable chip attach adhesive 328 is irradiated from the glass 312 side using a collimated UV source (not shown). The area under the chips is exposed while the area away from the chips remains unexposed. The adhesive is then developed in a spray developer using propanol as the developer. This removes the adhesive everywhere except under the chips 330, 332. The positioning and size of the mask openings are such that a small area around the edge of each chip is also removed by the developer. It can be seen that each chip is now face down on a small pedestal formed by the exposed chip attach adhesive 328. It is desirable to clean and prime the chip before applying the structural material (i.e., the filler/encapsulant) so that the adhesion of the filler/encapsulant to the chips is enhanced. A suitable plasma etch condition is 6 minutes at 400 W in a barrel etcher using 30% $CF_4/O_2$ gas. This cleans all exposed surfaces of the chips including the area around the edges of the chips. It also removes a small amount of the polyester film 316, increasing the height of the resultant pedestal. As shown in FIG. 3F, a structural material such as a dielectric filler/encapsulant 336, e.g., a liquid epoxy resin, is added to the assembly to cover all exposed surfaces on the back. To increase strength and improve the expansion match of the filler/encapsulant to that of the silicon chips, the filler/encapsulant can be loaded with an inert powder such as alumina or glass particles. The filler/encapsulant can be poured or dispensed onto the alignment carrier, or the alignment carrier may be covered at its outer edges or other locations on the carrier with a mold form and injection molded, or covered with a frame and frame molded.

In one embodiment, the filler/encapsulant is dispensed by a liquid dispensing machine such as a Cam-A-Lot Dispensing Machine available from Cam-A-Lot Division of Cookson Electronic Equipment located in Franklin, Mass. The dispensing machine accurately dispenses the relatively high viscosity loaded epoxy to the edge of the alignment carrier. The viscosity keeps the filler/encapsulant from flowing off the carrier. This eliminates the need for molds or frames in the fabrication process. Alternatively, a mold may be used if it is required to contain the filler/encapsulant in cases where viscosity is low or where injection molding is used. Epoxy Molding Compound or Underfill Material suitable for this application is also available from Cookson Electronics-Semiconductor Products of Suwanee, Ga.

In one embodiment, a two-part epoxy system is used, which can be cured at or near room temperature. The epoxy is filled, in one embodiment, with approximately 65-85 weight percent of alumina powder.

The epoxy is allowed to cure at low temperature so that no expansion effects impact the stress and initial alignment of the chips. The cured filler/encapsulant is then lapped or ground to the appropriate thickness. The filler/encapsulant and chips are thinned to a minimum thickness. This thickness is currently in the range of 50 to 100 microns. It is possible to go thinner than that thickness, but there is a tradeoff between lapping/grinding speed and final chip thickness. It is well known that there is typically damage beneath the exposed surface layer that is proportional to the lapping or grinding grit size. However, a finer grit would result in a longer lapping/grinding time. Noting that the chips are rigidly held by the alignment carrier, there is little penalty in going very thin except the economy of lapping/grinding more slowly or using multiple grit sizes. There are presently automated grinders available that have a fine and coarse grinding wheel in the same system. Such a system is the Disco DFM2700 and the Disco DFG8560 available from DISCO Corporation of Tokyo, Japan. Tapes for the process are available from Lintec Corporation of Tokyo, Japan or Mitsui ICROS of Tokyo, Japan. Lapping/grinding exposes the conductive through structures 324 for further processing. Alternatively, if the chips are adequately thinned before application of the filler/encapsulant, then the filler/encapsulant can be lapped/ground to a thickness that is greater than the chips, but still exposes the through connects. Practical molding techniques could also achieve this without a lapping/grinding step to thin the filler/encapsulant.

FIG. 3F shows in cross section the case where the filler/encapsulant is lapped or ground such that the chips 330 and 332 are thinned and the electrical through connect 324 is uncovered by the lap/grind operation, which allows electrical connection to be made to the through connect(s). As illustrated, the resultant structural material (i.e., filler/encapsulant) 336 contacts the sides of the integrated circuit chips 330, 332, and extends partially over the chip pad masks 340 as shown at the top surfaces of the inverted integrated circuit chips 330, 332. Note also that through connects 324 are, as mentioned, uncovered by the lap/grind operation (so that electrical connection may be subsequently made to these electrically conductive structures). While the example embodiment illustrates only two chips, it will be appreciated by those skilled in the art that generally an entire panel of chips may be processed at one time to take advantage of economy of scale. Also, note that the term "chip" is meant to encompass all manner of semiconductor, resistor, capacitor, inductor, conductive slug, electronic or optoelectronic device that may be accommodated by the processing described herein. It is also understood that layers of both single and multiple chip circuit structures are included in the scope of the present invention, as defined by the appended claims.

Figure 3G:
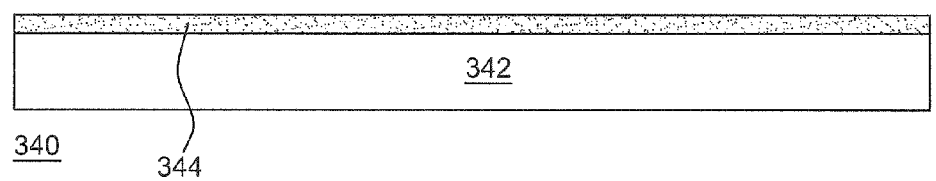
FIG. 3G is a cross-sectional elevational view of a structure comprising a temporary process carrier and a bonding adhesive, employed in fabricating a circuit structure (or electronic module), in accordance with an aspect of the present invention.
Figure 3H:
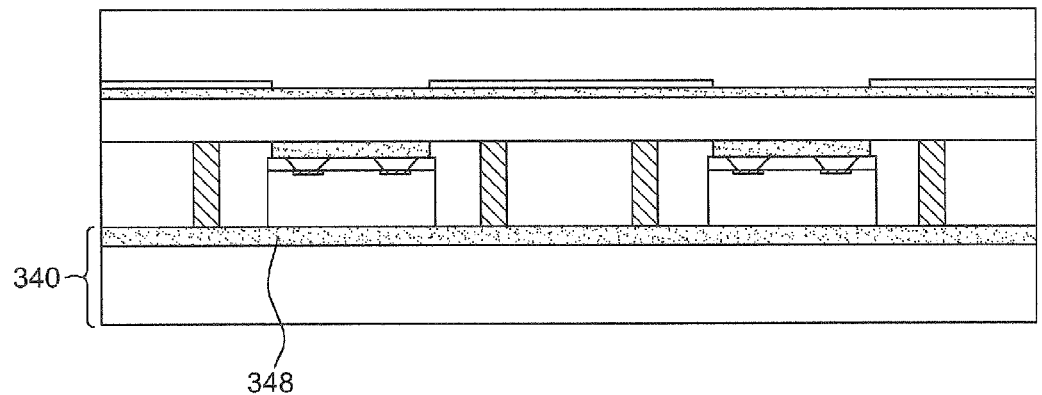
FIG. 3H is a cross-sectional elevational view of the structures of FIGS. 3F & 3G, after inverting the structures and bonding the temporary process carrier to the back surface of the chips-first layer, in accordance with an aspect of the present invention.

Attaching Process Carrier and Initiating Processing on Upper Surface:

As illustrated in FIGS. 3G & 3H, a process carrier (if desired) can next be attached to the back of the circuit structure or module. This process carrier, comprises (in one embodiment) a temporary process carrier that is subsequently removed from the completed chips-first module, as explained further below. The temporary process carrier serves another useful function. Before the process carrier is attached to the back of the assembly, the chips are held in exact alignment by the alignment carrier. If the process carrier is attached before the assembly is removed from the alignment carrier, then the process carrier will continue to hold the chips in alignment. If the assembly is removed before the process carrier is attached, then shrinkage of the encapsulant/filler will tend to move the chips relative to one another and impact the exact alignment. The greatest impact is in the area of lithography where alignment would otherwise be affected to the extent that large panels could not be accurately aligned and exposed using a single alignment for the entire panel. This could significantly effect the throughput economics of the lithography steps of the process. As an alternative embodiment, if the filler/encapsulant is strong enough to stand on its own through out the processing, then no process carrier is attached to the back of the assembly. This has the advantage that no process carrier is required and the cost of the process carrier and its attachment are eliminated, although the precision alignment might be effected. Steppers are now available that may be used to perform multiple alignments and exposures over the panel to partially compensate for any shrinkage caused misalignment. One such a stepper for aligning large panels is the Ultratech Spectrum 300 stepper available from Ultratech of San Jose, Calif.

FIG. 3G shows one embodiment of a process carrier 340 that includes two parts: a temporary process carrier 342, to hold the assembly rigidly during processing, and an adhesive layer 344 applied to the temporary process carrier 342. As explained below, upon completion of processing, the temporary process carrier is separated from the panel of chips-first circuit structures or modules.

Details on attaching a process carrier may be found in the above-incorporated, commonly-assigned U.S. Pat. No. 7,619,901. In accordance with the teachings of this patent, the process carrier and alignment assembly are taped into frames. A liquid adhesive is then applied to the adhesive layer 344. The pieces are then placed in a laminating fixture such that excess adhesive is contained by the tape, and the alignment carrier assembly and process carrier are held in alignment during the attachment process. The liquid adhesive spreads very thin and melds with the adhesive layer on the process carrier to form a single line of bonding adhesive 348, as shown in FIG. 3H, which depicts the resultant structure with the process carrier 340 attached to the alignment carrier and circuit assembly via adhesive layer 348.

Figure 3I:
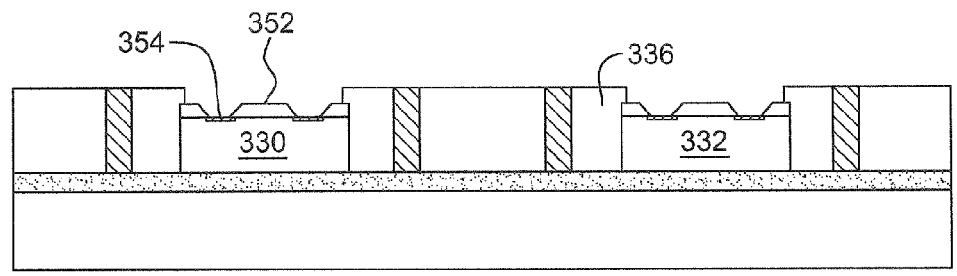
FIG. 3I is a cross-sectional elevational view of the structure of FIG. 3H, after removal of the glass alignment plate, polyester film and cured chip attach adhesive over the pad mask(s) of the chips, in accordance with an aspect of the present invention.

The alignment carrier is next separated from the partially processed chips-first base, as illustrated in FIG. 3I. Note that the UV-release tape has already been exposed to UV energy and therefore has minimal adhesion to the glass plate with the UV-opaque mask pattern on one side. The alignment carrier can be easily removed by prying from a corner. Moderate heating of the assembly at this point aides the removal process as it slightly softens the adhesive and makes separation easier. Additionally, the removal process is aided by making the process carrier slightly smaller than the alignment carrier. This prevents any adhesive squeezed out during the lamination operation from adhering to the alignment carrier edges. If the adhesive does contact the edge of the alignment carrier it bonds the two carriers at the edges and hampers separation. The separation occurs at the UV-release adhesive to alignment carrier glass interface and therefore leaves the UV-release film attached to the top of the partially processed chips-first module. At this point, a corner of the film is engaged and peeled in a 90 degree peel. This process works because of the difference between the adhesion of the film over an area and the adhesion of the film when peeled. It should be noted that the adhesion is quite sufficient to hold the chips in accurate position due to high shear capability of a thin glue line over the area of the chips. When a 90 degree peel is initiated, the adhesive gives up readily as the adhesive force of the very thin adhesive is spread over a concentrated area of the bend point of the peel.

Any residual adhesive left on the chips is now cleaned off. The first step in this process is to soak the structure in acetone, which lifts the cured adhesive film from the tops of the chips. The second step is a light plasma etch, with either $O_2$ or $O_2/CF_4$ (30/70) to remove any residual adhesive that was not removed by the acetone soak. A final step is cleaning by wet processing (heated surfactant and DI water) which removes any residual ions such as sodium and chloride from the surface of the chips. FIG. 3I shows a cross-sectional view of the chips-first base ready for application of the interconnect layer(s). Note that the entire edge of each chip 330, 332 is covered by the filler/encapsulant 336, and a small portion of the upper surfaces of the chips (around the edges thereof) is covered by the filler/encapsulant 336. Note further that the chips' pad masks 352 provide an insulating layer above the chips and provide access to the individual contact pads 354 of the chips. When IC chips are fabricated, they are provided with a passivation layer on the top surface of the chip that mechanically and electrically protects the chips. This passivation layer is provided with openings to the contact pads of the chips, and this passivation layer with openings is referred to in this description as the pad mask. For the purpose of this disclosure, a pad mask is any layer that is applied to the surface of the chips before they are placed into a chips-first structure, and which provides dielectric insulation of the chips and allows access to the contact pads of the chips. This layer is typically applied by the chip manufacturer before the wafer is diced into individual chips, but for this discussion, may alternatively be applied after dicing, thereby potentially coating both the top surface and a portion of the edges/sides of the chip.

At this point (in prior art structures not employing a filler/encasulant configured as described above), a first level dielectric would be applied and via holes patterned above individual contact pads of the chips. The first level dielectric layer conventionally serves (in part) to prevent shorting of the subsequent first level metallization to the edges of the chips. After application of the dielectric layer, metallization would be applied and patterned to form the first level interconnect layer. In accordance with an aspect of the present invention, however, the complete coverage of the chip edge by the filler/encapsulant 336 prevents shorting of a subsequently applied first level metallization to the edges of the chips, and the pad masks 352 already on the chips 330, 332 prevent shorting of the metallization to electrical structures of the chips.

In one embodiment, seed metallization (not shown) is sputtered onto the chips 330, 332 and the encapsulant/filler 336. Sputtering is well known in the art and includes the steps of back-sputtering in order to clean the surface, remove insulating oxide on the chip pads, and improve adhesion of the metal layers. This is followed, in one embodiment (and without breaking vacuum), by sputtering a thin layer of titanium for adhesion, followed by a seed layer of copper. The titanium thickness may be 200 angstroms and the copper thickness 4000 angstroms. A resist layer is then coated over the sputtered copper, and the resist is exposed and developed. Resist materials with excellent aspect ratio are well known in the art, and include, for example, AZP 4620 (a positive resist available from AZ Electronic Materials of Somerville, N.J.) and BPR 100 (a negative resist available from Shipley of Marlborough, Mass., now part of Rohm and Haas, of Philadelphia, Pa.). The resist is patterned with openings where the copper interconnect runs are desired. The copper is then electroplated to a thickness required by subsequent processing steps. A thickness of 3 to 6 microns may be used. The resist is removed by methods well know in the art, and depending on whether a positive or negative resist is used. The sputtered copper and titanium seed layer is removed by etching the copper in ammonium persulfate and etching the titanium in a $CF_4/O_2$ (95/5) Reactive Ion Etch Plasma.

Alternatively, an argon ion plasma may be used. The plasma is preferred to wet chemical etching of the titanium since it is very accurately controlled and will do minimal damage to the aluminum pads and pad masks of the chips. This is especially true if the metalization pattern is made smaller than the opening(s) of the pad masks. Making the metalization pattern smaller than the pad mask's openings allows improved resolution and less sensitivity to slight misalignment of the chips. It should be noted that the pad mask on small pad pitch chips involves relatively large openings for probing and wirebonding with minimal space between adjacent pad openings. Copper metalization is now common in high performance chips.

Frequently, the pads of the chips include copper with a layer of aluminum to allow for improved wirebonding. This is not required in the structures described herein, and bare copper pads may be used. In the case of bare copper pads, if the seed copper etch step damages the pads, then the thickness of the titanium layer may be increased (for example) to 1000 angstroms to protect the copper pads on the chip. It should also be noted that no damage to the pads will occur if the pad mask is framed by the metallization pad, but this may significantly increase sensitivity to misalignment. This discussion is intended to identify some of the options and advantages that are afforded by structures fabricated in accordance with aspects of the present invention. The ability to pattern the first interconnect layer without deep vias through a dielectric allows for finer resolution, which is important in making interconnection to fine pitch chips.

Figure 3J:
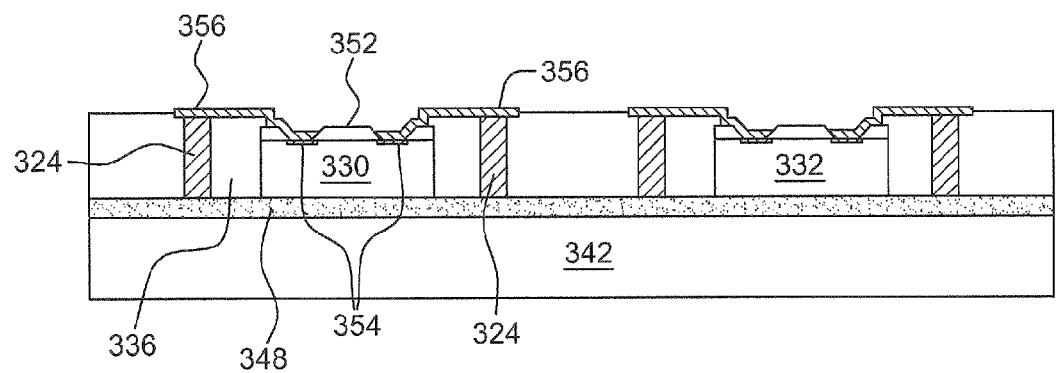
FIG. 3J is a cross-sectional elevational view of the structure of FIG. 3I, after disposition of a patterned metallization layer over the front surface of the chips-first layer, producing one embodiment of a circuit structure, in accordance with an aspect of the present invention.

FIG. 3J illustrates a cross-sectional view of a circuit structure (or electronic module), in accordance with an aspect of the present invention. As shown, the structure includes a first level patterned metallization 356 (e.g., copper) disposed on filler/encapsulant 336 and pad mask 352, and making connection to the contact pads 354 of the chips 330, 332 and to the through connects 324. Although shown as individual non-connected chips-first structures in the figures, it should be appreciated by one skill in the art that multichip chips-first structures (or layers) may also be fabricated and interconnected by the metallization layer interconnect described above. Note that if it is desired to add input/output interconnect structures to the underside of the chips-first module, then the step of removing the seed layer may be delayed until later in the processing, as described further below. If it is the desired to add input/output interconnect structures to the upper surface of the chips-first structure, then the following steps may be performed.

Figure 3K:
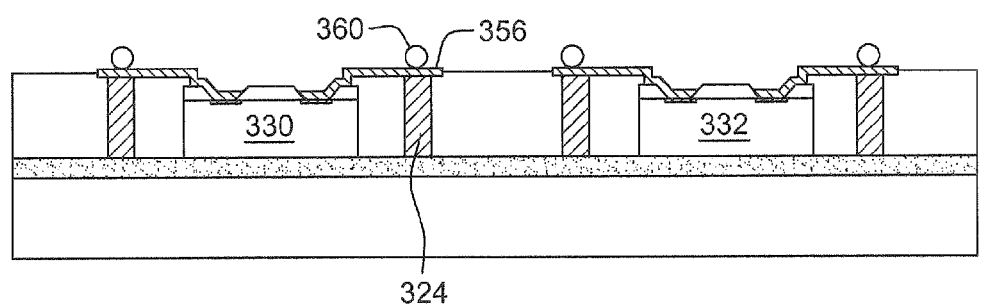
FIG. 3K is a cross-sectional elevational view of the structure of FIG. 3J, subsequent to disposition of input/output interconnect structures over the front surface of the chips-first layer, in direct physical and electrical contact with the metallization layer thereon, in accordance with an aspect of the present invention.

Adding I/O Interconnect Structures to the Upper Surface of the Chips-First Structures:

A first step is to add input/output interconnect structures to the module. In one embodiment, the chips-first structures described herein facilitate stacking thereof, and the I/O interconnect structures facilitate the interconnection of the chips in the stack, as well as providing input/output contacts for the stack. The I/O interconnect structures are provided specifically for a chosen approach for interconnecting from one layer to another layer, and from the stack of chips-first layers to the supporting substrate, such as a printed circuit board substrate. There are several approaches to interconnecting the chips-first layers in the stack, which are described below. For example, chips-first layers may be interconnected by soldering, by conductive epoxy or by Z-axis conductive polymer (anisotropic conductive interconnect). The input/output interconnect structure for a given fabrication method may be, for example, a bump, a conductive post or a stud (collectively referred to herein as the input/output interconnect structures). The fabrication of each of these I/O modalities is generally known in the art, and only briefly described herein. Solder bumps may be formed either by electroplating or by screen printing and reflow techniques. Posts and studs may be formed by electroplating, for example, with copper, to form the structure and then providing a suitable electrical surface by plating a nickel under layer followed by a gold layer to provide an oxide-free surface for electrical connection or to provide a solderable surface. FIG. 3K illustrates I/O interconnect structures 360 formed on metallization layer 356 over the upper surface of the chips-first layer. Note that the I/O interconnect structures are formed (in one example) directly above the electrically conductive structures 324, for example, to facilitate electrical connection of the chips 330,332 within a stack of the chips-first layers.

Figure 4A:
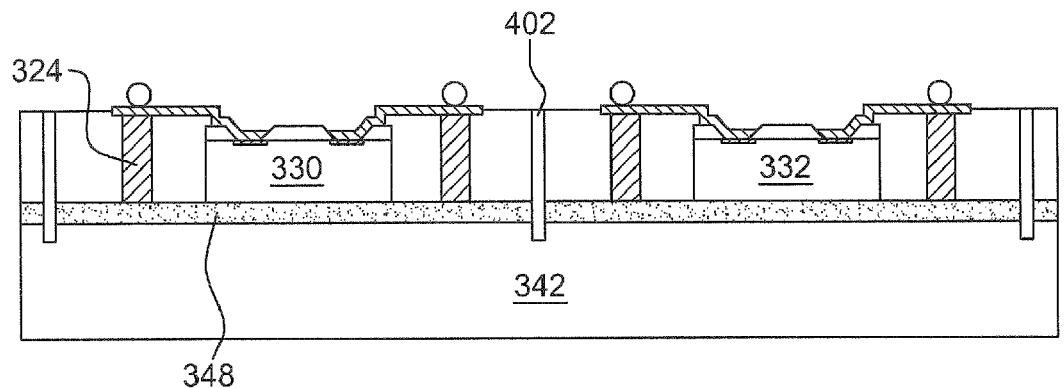
FIG. 4A is a cross-sectional elevational view of the structure of FIG. 3K, after partially cutting through the structure during processing to produce single-chip circuit structures (or electronic modules), in accordance with an aspect of the present invention.
Figure 4B:
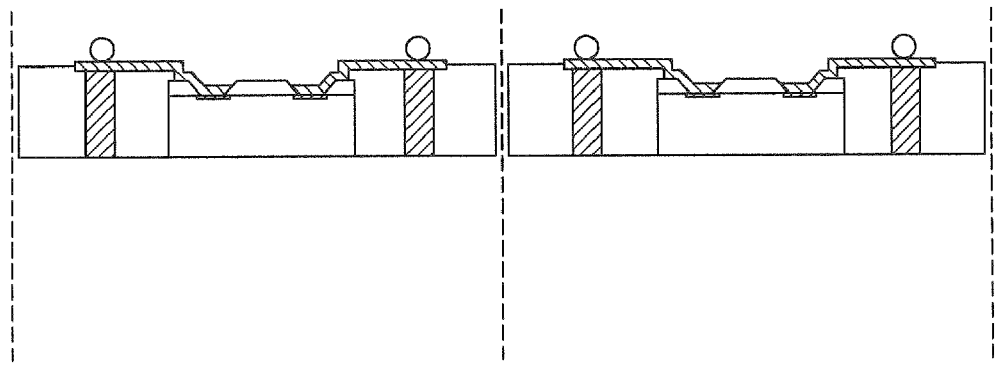
FIG. 4B is a cross-sectional elevational view of the structure of FIG. 4A, after removal of the temporary process carrier and bonding adhesive on the back surface of the chips-first layer to produce multiple single-chip chips-first circuit structures, in accordance with an aspect of the present invention.

Singulation of Chips First Panel:

Although shown as only two chips, the concepts disclosed herein can be employed to advantageously fabricate a chips-first panel including a large number of chips so that economy of scale may be achieved. Processing may be completed by singulation of the panel of structures into individual modules. If a temporary process carrier is used, then the individual modules may be singulated by dicing part way into the process carrier from the circuit structure side of the assembly and then removing the process carrier leaving the singulated modules, as illustrated in FIGS. 4A-4B. Fully automated equipment typically used for singulating wafers may be used to accomplish this operation. This process is known as Dice Before Grind (DBG).

FIGS. 4A & 4B illustrate the process flow for singulation of a chips-first panel. First a diamond saw or laser cuts 402 partway into the panel deep enough to cut into the process carrier 342 or at least the process carrier adhesive 348. This is shown in FIG. 4A. The partially cut panel is then attached at its upper surface to soft protective tape (not shown), where the soft tape accommodates the thickness of the I/O structures on the module. Next, the process carrier 342 is ground until the proper thickness is achieved. In the case where the filler/encapsulant is thicker than the chips, the grinding stops when the filler/encapsulant has been reached or when the desired thickness of the module has been achieved. Typically, grinding may proceed until the backs of the chips 330, 332 are reached, in which case the backs of the chips as well as any through connects 324 will be exposed. This option is of benefit in stacked systems where a minimum layer thickness is desirable. The resultant chips-first structures are shown in FIG. 4B. In each case, the next step is to laminate a second tape to the back of the protective tape and then peel away the protective tape (not shown). At this point, the individual singulated modules may be picked and placed by conventional pick and place equipment intended to pick Wafer Level CSP modules. DISCO of Tokyo, Japan and others sell complete turnkey systems for the DBG process including dicing, protective taping, grinding, back side taping and removal of the protective tape.

Figure 5A:
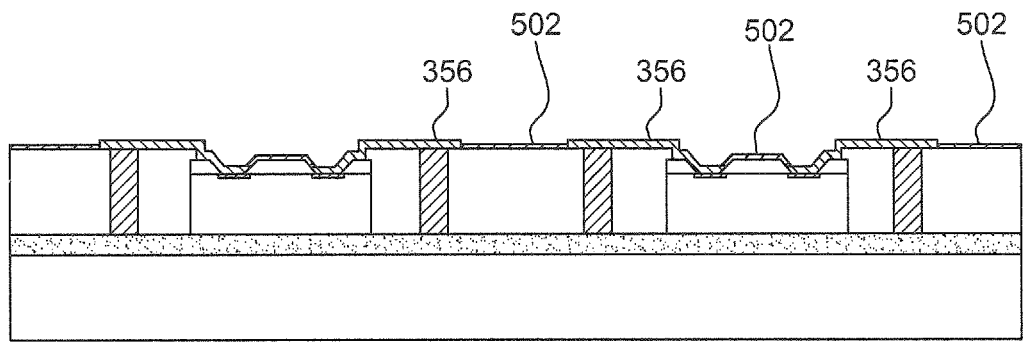
FIG. 5A, which begins an alternate fabrication approach, is a cross-sectional elevational view of the structure of FIG. 3J, with the seed metal for the metallization layer shown in place over the front surface of the chips-first layer, in accordance with an aspect of the present invention.
Figure 5B:
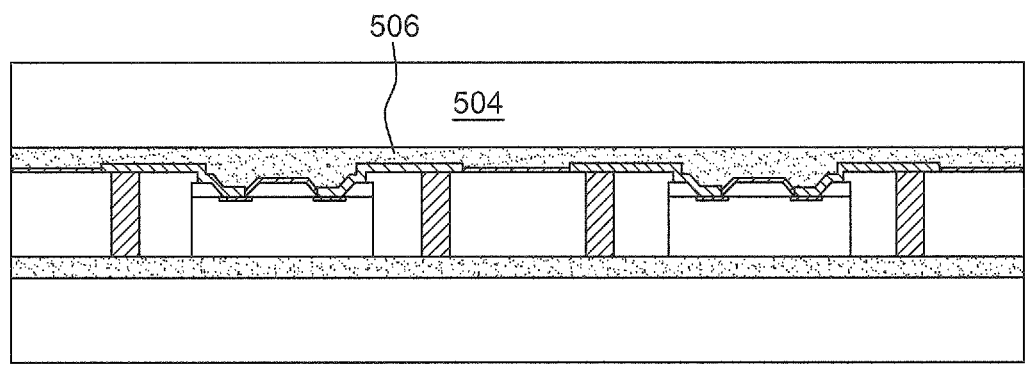
FIG. 5B is a cross-sectional elevational view of the structures of FIGS. 5A & 3G, after inverting and bonding the temporary process carrier of FIG. 3G to the front surface of the chips-first layer, in accordance with an aspect of the present invention.

Adding I/O Interconnect Structures to the Back Surfaces of the Chips First Structures:

In order to add I/O interconnect structures to the back surface of a chips-first module, the processing flow proceeds as described above in connection with FIGS. 3A-3J, until the point where the seed layer for the metallization layer over the front surface of the chips-first layer is removed. FIGS. 5A-5E illustrate one embodiment of further processing for adding I/O interconnect structures to the back surface of such a chips-first structure. Referring first to FIG. 5A, a panel is shown wherein a seed metal 502 remains after the photoresist, which was employed in forming the pattern metallization 356, has been removed. Details of attachment of a second process carrier to the assembly may be found in the above-incorporated, commonly assigned U.S. Pat. No. 7,619,901. In that patent, the chips-first structure is on a first process carrier, and a second process carrier is coated with an adhesive and taped into frames. Liquid adhesive is applied to the adhesive coated second process carrier, and then the pieces are placed in a laminating fixture such that excess adhesive is contained by the tape and the two assemblies are bonded. The two process carriers are held in alignment during the attachment process. FIG. 5B illustrates the attachment of the second process carrier 504 with bonding adhesive 506 to the assembly. At this point, the first process carrier may be removed, either by lapping or grinding, as described above.

Figure 5C:
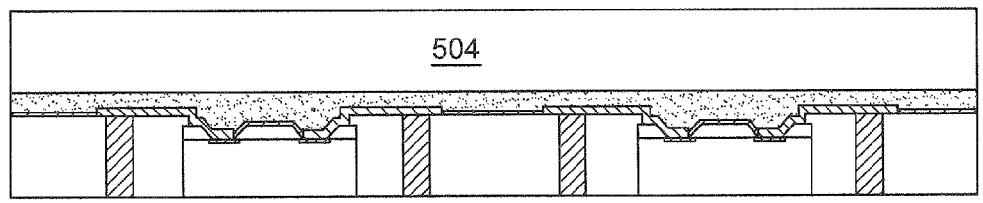
FIG. 5C is a cross-sectional elevational view of the structure of FIG. 5B, after removing the glass alignment plate and polyester film from the back surface of the chips-first layer, in accordance with an aspect of the present invention.

FIG. 5C illustrates the assembly after the removal of the first process carrier. Bumps, posts or studs (i.e., I/O interconnect structures 508) may now be added to the under side of the assembly, in a manner analogous to that described above. It should be noted in this regard that an optional metal redistribution layer (not shown) may be added before the I/O interconnect structures are applied, by processing well known in the art, including: applying a seed layer, applying photoresist, patterning the resist, plating the interconnect and removing the resist and seed layer. Such a redistribution layer can provide redistribution interconnect, as well as make contact to the lower surfaces of the chips for electrical and thermal connection.

Figure 5D:
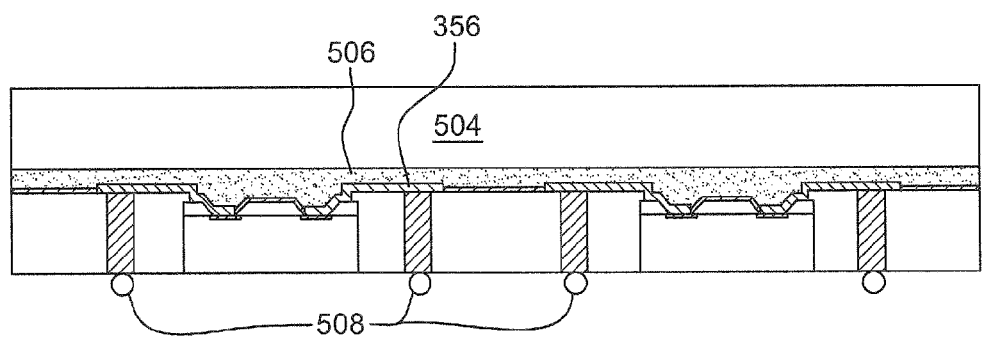
FIG. 5D is a cross-sectional elevational view of the structure of FIG. 5C, after disposition of input/output interconnect structures over the back surface of the chips-first layer in direct physical and electrical contact with the lower surfaces of the electrically conductive structures extending through the chips-first layer, thereby electrically connecting the input/output interconnect structures to the metallization layer on the front surface of the chips-first layer, in accordance with an aspect of the present invention.
Figure 5E:
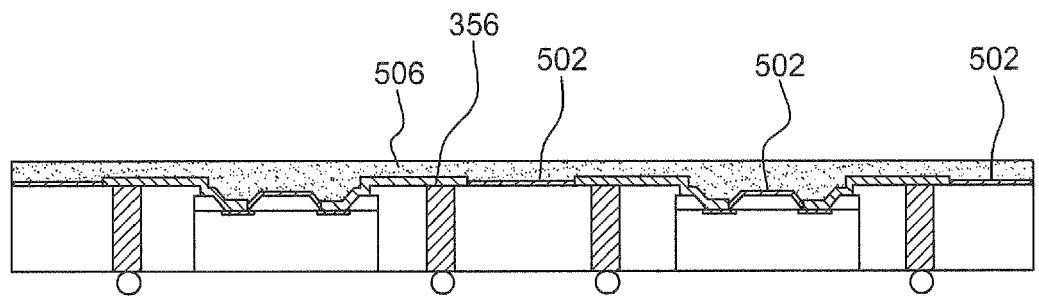
FIG. 5E is a cross-sectional elevational view of the structure of FIG. 5D, after removal of the temporary process carrier, in accordance with an aspect of the present invention.
Figure 5F:
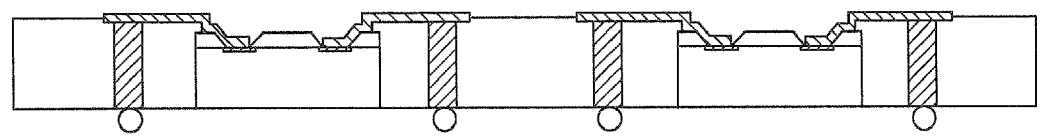
FIG. 5F is a cross-sectional elevational view of the structure of FIG. 5E, after removal of the residual adhesive and the seed metal, in accordance with an aspect of the present invention.
Figure 5G:
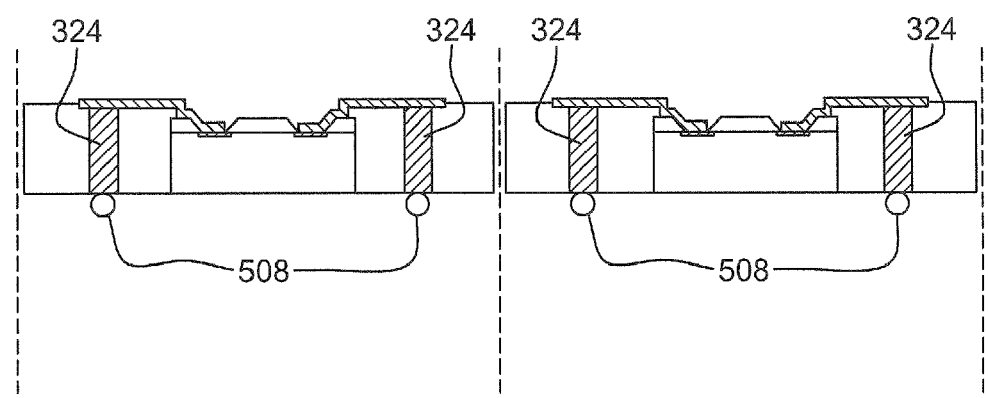
FIG. 5G is a cross-sectional elevational view of the structure of FIG. 5F, after cutting through the chips-first layer to produce single-chip circuit structures (or electronic modules), in accordance with an aspect of the present invention.

One embodiment of the resultant assembly, mounted on second temporary process carrier 504, is shown in FIG. 5D. Next, the second process carrier may be removed. In one embodiment, the second process carrier is removed by lapping/grinding into the bonding adhesive 506. In this way, the metallization 356 over the upper surface of the chips-first layer is not damaged by the lapping/grinding. Further, the thickness tolerance is reduced since the lapping/grinding may stop anywhere in the bonding adhesive 506, which typically is on the order of 40 microns thick. FIG. 5E illustrates the second temporary process carrier having been removed, but with the bonding adhesive 506 remaining. The bonding adhesive may be removed by, for example, a 30% $CF_4$ 70% $O_2$ plasma etch. The plasma etches the bonding adhesive which is for example an epoxy, but has no effect on the copper seed layer 502. This allows the bonding adhesive to be cleanly removed without damaging the underlying metallization pattern 356. Once the bonding adhesive has been removed, the seed layer 502 may be removed by etching in persulfate and plasma, as described above. FIG. 5F illustrates the circuit structure after removal of the residual adhesive and seed metal. A final step in the process is to singulate the panel into individual chips-first circuit structures. Taping and dicing may be employed as described above. FIG. 5G depicts the singulated chips-first circuit structures, with the I/O interconnect structures 508 shown in electrical and physical contact with the lower surfaces of the electrically conductive structures 324 extending between the back surface and front surface of the chips-first structures.

Figure 6:
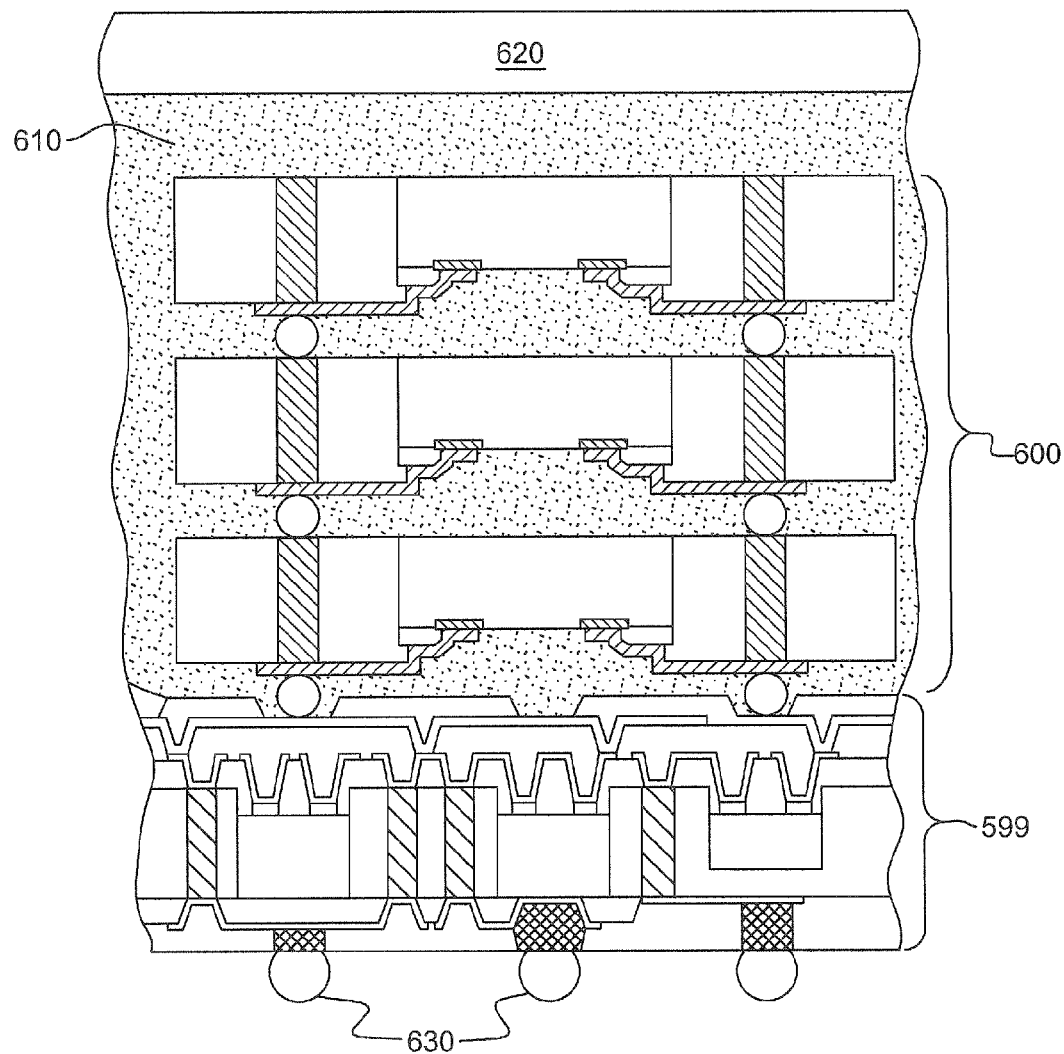
FIG. 6 is a partial cross-sectional elevational view of one embodiment of a circuit structure (or electronic module), comprising a base chips-first layer supporting a stack of multiple chips-first layers, in accordance with an aspect of the present invention.

Assembling Stacks of Chips-First Structures:

Once the individual chips-first structures have been fabricated, they may be (in one embodiment) stacked in multiple layers onto a substrate, which provides a final interconnect to the exterior system. By way of example, FIG. 6 illustrates the use of a chips-first circuit structure 599 as a base layer/substrate for the stack 600. After the individual layers are stacked, they can be encapsulated in a molding compound to form a completed circuit structure. In many systems, the substrate can be another chips-first circuit structure, such as described in the above-incorporated, commonly assigned U.S. Pat. No. 7,619,901. The advantage of using a chips-first circuit structure as a substrate for assembly of the stacked structure (for example a stack of memory chips), is that there can be further integrated circuit chips in the substrate 599, as illustrated in FIG. 6. This substrate layer of integrated circuit chips may be, for example, further memory chips, or alternatively, a memory controller or memory manager for the stack of memory chips. In the example of FIG. 6, an encapsulant 610 surrounds the stack 600, which (in this embodiment) is inverted to face the contact surface of the underlying chips-first circuit structure 599. A stiffener layer 620 may optionally be provided over encapsulant 610. By way of example, the pitch and size of the I/O interconnect structures 630 at the lower surface of the chips-first circuit structure 599 may be different from the pitch and size of the I/O interconnect structures electrically connecting the chips-first layers of the stack of chips-first layers together, and connecting the stack to the base, chips-first circuit structure 599.

Figure 7A:
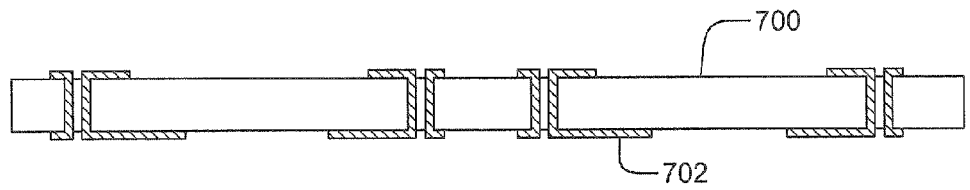
FIG. 7A is a cross-sectional elevational view of one embodiment of a printed circuit board substrate, to accept a stack of multiple chips-first layers, in accordance with an aspect of the present invention.
Figure 7B:
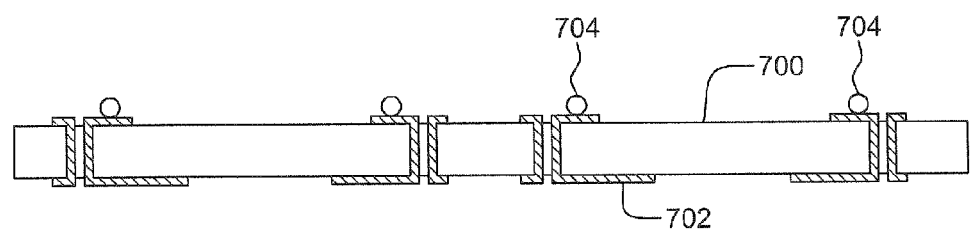
FIG. 7B is a cross-sectional elevational view of the structure of FIG. 7A, after disposition of input/output interconnect structures over the surface of the printed circuit board substrate to accept one or more stacks of multiple chips-first layers, in accordance with an aspect of the present invention.
Figure 7C:
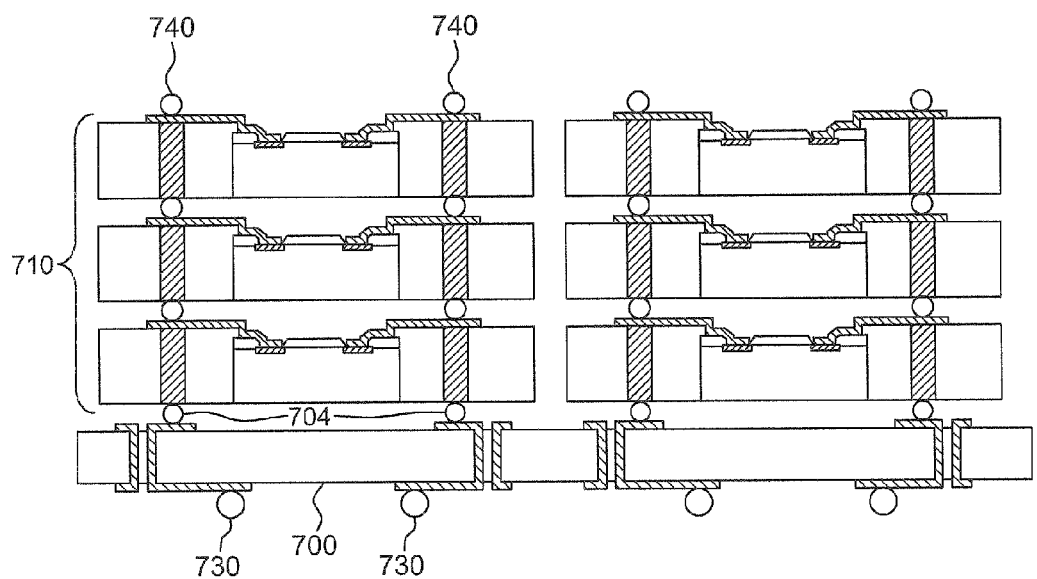
FIG. 7C is a cross-sectional elevational view of the structure of FIG. 7B, after mounting of multiple stacks of chips-first layers over the printed circuit board substrate, in electrical contact therewith via multiple sets of input/output interconnect structures disposed, between the individual chips-first layers of each stack and illustrating optional input/output stack interconnect structures over the upper surface of the top most chips-first layer in each stack, as well as the optional disposition of input/output stack interconnect structures on the back surface of the printed circuit board substrate, which as shown, may have a different size and pitch than the size and pitch of the input/output interconnect structures electrically interconnecting the chips-first layers of the respective stacks, in accordance with an aspect of the present invention.
Figure 7D:
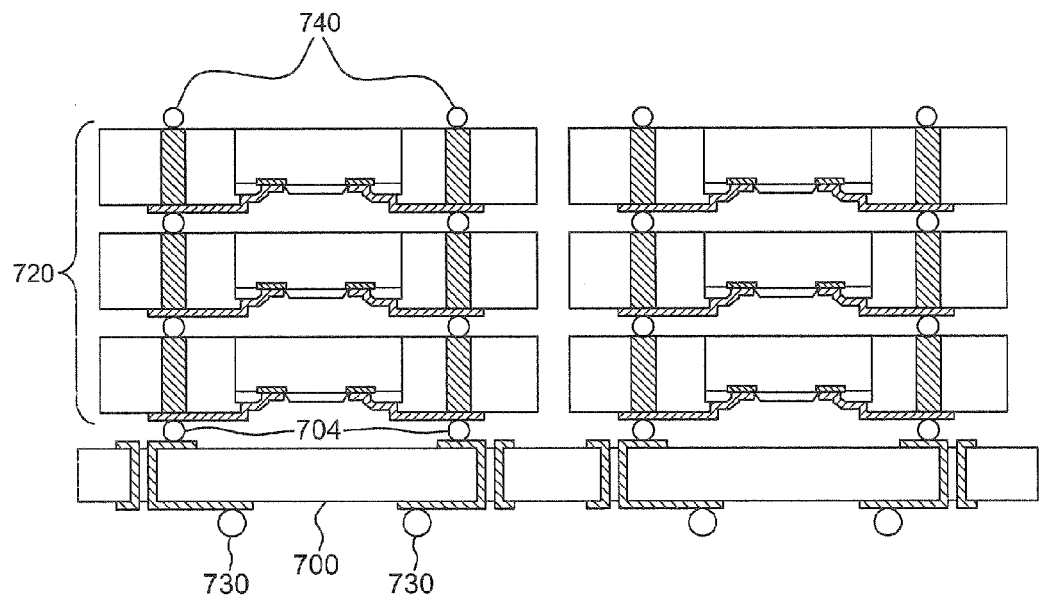
FIG. 7D is a cross-sectional elevational view of an alternative embodiment of a circuit structure comprising multiple stacks of chips-first layers over the printed circuit board substrate, wherein the stacks of chips-first layers are shown inverted such that the front surfaces of the layers face towards the printed circuit board substrate, and shown with optional input/output stack interconnect structures over the back surface of the top most chips-first layer in each stack, and with optional input/output stack interconnect structures of different size and pitch on the back surface of the printed circuit board substrate, in accordance with an aspect of the present invention.

FIGS. 7A-7D depict alternate stacked circuit structures, in accordance with aspects of the present invention. As illustrated in FIG. 7A, these alternate circuit structures may be assembled above a printed circuit board substrate 700, having metallization 702 extending there through. In one embodiment, shown in FIG. 7B, I/O interconnect structures 704 are provided in electrical and physical contact with the metallization pattern 702 of the printed circuit board substrate 700. There are several approaches to interconnecting stacked chips-first layers. For example, FIG. 7C illustrates two, three layer stacks 710, with the active sides of the chips within the layers facing away from the underlying printed circuit board substrate 700, while FIG. 7D illustrates a structure comprising two, three layer stacks 720, each with the active sides of the individual circuit chips in the layers facing the printed circuit board substrate 700. Each approach has certain advantages. Note also that the pitch and size of the I/O stack interconnect structures 730 on the underside of the printed circuit board substrate 700 may be different from the pitch an size of the I/O interconnect structures 704 connecting the stacks to the printed circuit board substrate, as well as electrically connecting the individual layers within the stacks together. Note that in both the stacked structure embodiment of FIG. 7C, and the stacked structure embodiment of FIG. 7D, additional I/O stack interconnect structures 740 may be provided at the exposed top surface of the individual stacks 710, 720, which in FIG. 7C is the active side of the top most chips-first layers, and in FIG. 7D is the back side of the topmost chips-first layers.

Stacks of Layers with Solder Bumps on the Top or Bottom of the Layers:

One approach to interconnecting chips-first layers is by solder. As noted, in the exemplary embodiment of FIGS. 7A-7D, a printed circuit board substrate may be provided that has printed circuit metallization 704 on one side that corresponds to the I/O interconnect structures of the layers to be stacked, and on the other side has pads where bumps 730 can be provided for interconnection of the final stack into, for example, a cell phone or other electronic system. If the I/O interconnect structures for the stacked layers face the circuit board, then the substrate need only have circuit board traces. FIG. 7A shows printed circuit board substrate 700 with metallization 702 ready to accept module stacks, where the modules are assumed to have bumps facing toward the substrate. If the I/O of the layers are facing up, then the circuit board may be provided with I/O interconnect structures that interface to the under side of the stack, which does not otherwise have bumps.

As noted, in one embodiment, the I/O of the layers may be facing the circuit board. In this case, each layers may be dipped in flux. Preferably the flux is a "no clean flux" since in very thin stacks it is difficult to adequately clean between the layers. "No clean fluxes" are known in the art and as an example, Flux TFD 38 available from Heraeus of South Bend, Ind., can be used. This flux is known to have good adhesion to underfill. The chips-first layers to be stacked are dipped in flux per the manufacturers' instructions and then placed first on the circuit board, and then on the back of the previous layer. In one embodiment, all layers are placed and then the entire structure is reflowed in one operation. Alternatively, the structures of a given layer may be placed and reflowed, and then chips-first structures for the next layer may be placed and reflowed, and so on, until all layers have been placed and reflowed.

It is desirable that the layers be as thin as possible so that the total thickness of the stack is minimized. When chips-first layers are thin they are fragile, and underfill is desired in order to increase the robustness of the stack. Applying underfill to each individual stack layer is difficult when the layers are well aligned since there is no flat area that is adjacent to the edges of the individual layers to deposit the underfill. Offsetting alternate layers in the stack is one way to ease this problem by providing a ledge for underfill dispensing, but it adds area to the stack. The so called "no flow underfills" are well suited to underfill for stacks. "No flow underfills" are a combination of adhesive, usually epoxy, and flux. The underfill would be dispensed into the circuit board in a pattern that would allow the spreading of the underfill under the layer. The first layers of chips are then placed. A second layer of "no flow underfill" is then dispensed and the second chips-first layers are placed. This is repeated until all chips-first layers of the stacks are placed. During reflow the fluxing action aids solder reflow while the adhesive wets the surfaces and then cures, bonding the stacked layers and circuit board together. Two suitable "no flow underfills" are UF 3667 available from 3M Corporation of St. Paul, Minn., and FF2000 available from Hysol/Henkel Co. of Irvine, Calif. Again, if desired, each chips-first layer may have underfill dispensed and reflowed, before the next layer is added.

Figure 7E:
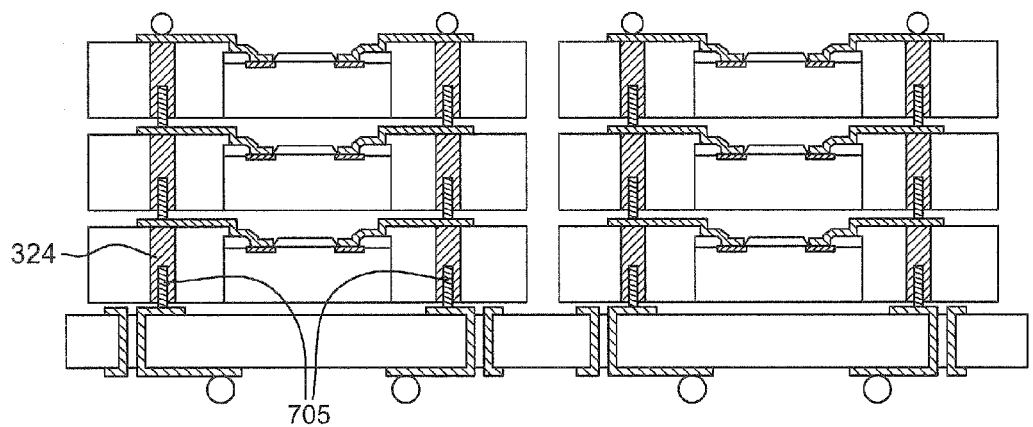
FIG. 7E is a cross-sectional elevational view of the structure of FIG. 7C, with input/output studs replacing the input/output bumps of FIG. 7C as the input/output interconnect structures, in accordance with an aspect of the present invention.

Stacks of Chips-first Layers where through Connects Comprise Solder:

In an alternate embodiment of the chips-first layers, the metal through connect structures (i.e., the electrically conductive structures) may be fabricated by plating solder (instead of copper) on top of the seed metal. The plating of the electrically conductive connect structures 324 is represented in FIG. 3C. The subsequently formed I/O interconnect structures can then be a solder bump, or a post or stud. If a solder bump is used, then the process is the same as outlined above except that there is more solder available to absorb any stress that may occur during fabrication or operation. If a post or stud is used, then the stud will be wetted by the solder from the through connect and the stud can move partway into the solder through connect, thus further reducing the thickness of the resultant stack. This is illustrated in the example of FIG. 7E, which depicts the stack of FIG. 7C, except that studs 705 are plated on the circuit board and the metallization layer at the front surface of the chips-first layers. Through connect 324 comprises solder, and when the stack is reflowed, the solder of the through connects melt and wet the interconnect studs 705, which are assumed to be of a higher melting point than the solder of the through connects, and therefore, do not melt. As a result, it can be seen that the interconnection studs move part way into the solder through connects.

It should be noted that only a portion of the through connect may be plated with solder. In this case, copper (for example) is plated for a period of time to give the desired thickness followed by plating solder. Generally, copper can be plated at a faster rate than solder, so process through-put may be improved by only partially plating solder.

Stacks of Chips-first Layers Interconnected by Conductive Polymer:

When conductive polymer is used, it is desirable to provide a surface finish on the interconnecting metal surfaces that does not oxidize in the environment of use. Gold plating is often used to provide this surface. In one embodiment, when the post or stud is plated up on the chips-first layer, a final step can be plating a nickel under-metal followed by plating of a gold surface. The exposed surface of the through connects may be surface finished as part of the processing. When the temporary processing carrier is removed by lapping or grinding, the through connects are exposed. Before the protective tape on the opposite side of the module is removed, the through connects may be plated with a suitable surface. Electroless plating techniques that provide a nickel under-metal with a gold surface are known in the art. The front of the modules will not be plated as the front surface is protected by the protective tape. The circuit board is preferably also plated with gold or non-oxidizing metal. Then, conductive adhesive is applied, for example by screen printing or individual dispensing, onto the circuit board in the locations where the posts or studs of the modules will connect. Chips-first structures are placed for a single layer such that the studs of the structures penetrate the conductive adhesive. The adhesive is cured or partially cured such that conductive adhesive can be screen printed onto the backs of the just placed structures and a second layer of chips-first structures placed. This process is continued until all layers of the stack have been interconnected. A suitable conductive polymer for this purpose is EPO-TEK B9126-8 available from Epoxy Technology of Billerica, Mass.

Stacks of Chips-First Layers Interconnected by Anisotropic Conductive Film/Adhesive:

When anisotropic adhesive is used, it is desirable to provide a surface finish on the interconnection metal surfaces that does not oxide in the environment of use. The section above details processing to apply such metal surfaces to the posts/studs and through connects of the chips-first layers. Anisotropic conductive adhesive or film has the advantage that in the areas where there is no electrical connection, the adhesive is still adding structural integrity to the assembly. Anisotropic adhesive is available as a screen printable epoxy as part 120-43 or 124-19 from Creative Materials of Tyngsboro, Mass. Anisotropic conductive films are available as Anisolm Film from Hitachi of Cupertino, Calif. The process starts by applying the anisotropic adhesive to the circuit board. In the case of paste anisotropic adhesive, this is done by (for example) screen printing or dispensing, and in the case of the anisotropic film the film is laminated to the circuit board. Next a heated alignment fixture picks and aligns each chips-first circuit structure and holds the structures in position under pressure until the adhesive has cured. This requires approximately 5 seconds at a pressure of 100 Mpa for the Anisolm Film. A second layer of chips-first structures may be applied in similar fashion by applying the adhesive and placing the second layer of structures over the first layer. This process is continued until all layers of the stack have been interconnected.

Figure 8A:
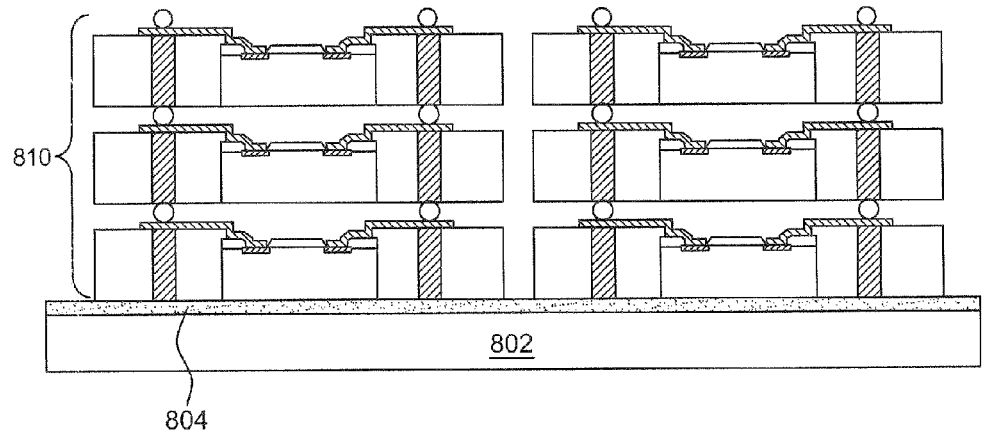
FIG. 8A illustrates an alternate embodiment of a circuit structure comprising multiple stacks of multiple chips-first layers supported by a stiffener layer, in accordance with an aspect of the present invention.
Figure 8B:
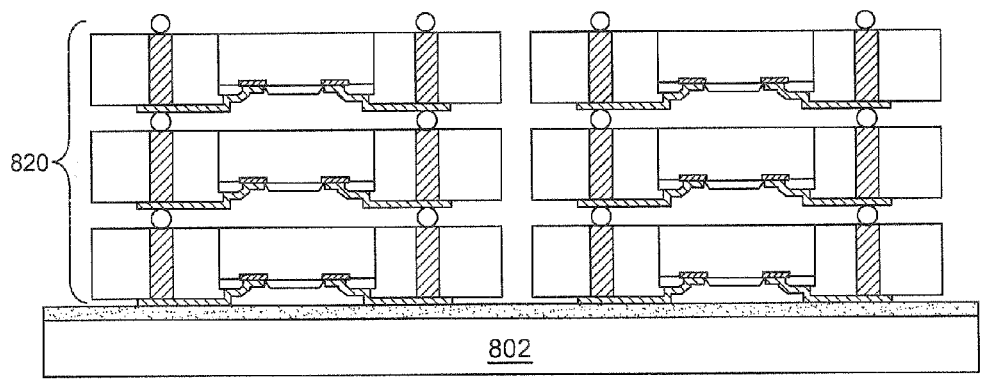
FIG. 8B is a cross-sectional elevational view of an another embodiment of a circuit structure comprising multiple stacks of multiple chips-first layers disposed over a stiffener layer, wherein the stacks of multiple chips-first layers are oriented with the layers' front surfaces facing the stiffener layer, in accordance with an aspect of the present invention.

Stacks of Chips-First Structures without Circuit Board Substrate:

In another embodiment, the individual chips-first structures may be stacked without connecting them to a circuit board or base chips-first structure. In this case, the bumps, post, or studs on the last layer in the stack may provide the I/O for the stack package. This approach can yield a very compact package and is simpler in that it does not require a circuit board substrate. Referring to FIG. 8A, the first layer of chips-first structures is placed on a stiffener layer 802 that has been coated with a bonding adhesive 804. The bonding adhesive may be epoxy die attach material, which is known in the industry. Alternatively, if "no flow flux underfill" will be used for the I/O interconnection, it may be the same material. The "no flow underfills" noted above may be used for this purpose. Alternatively, the bonding spacer materials used in conventional wirebonded stacks may also be used. It is desirable to use a stiffener layer that has a reasonable thermal expansion match to the materials of the package. For minimum thickness of the stacked package, the stiffener layer should have a high modulus so that it provides a maximum stiffness for a minimum thickness. Exemplary materials that meet these requirements are alumina, silicon, and molybdenum. The chips-first structures 810 shown in FIG. 8A are configured to have their I/O bumps, posts or studs facing away from the stiffener layer 802. FIG. 8B shows a similar configuration except that the I/O bumps, posts or studs are on the other side of the chips-first layers 820, such that the active sides of the chips face the stiffener layer 802. The interconnection of chips progresses as described above depending on the method of interconnect used. When the last module has been placed, the stiffener layer and attached panel of stacks is diced into individual stacked packages. The I/O bumps for connection to each stacked package are provided (for example) by the last chips-first layer in the stack.

Figure 9A:
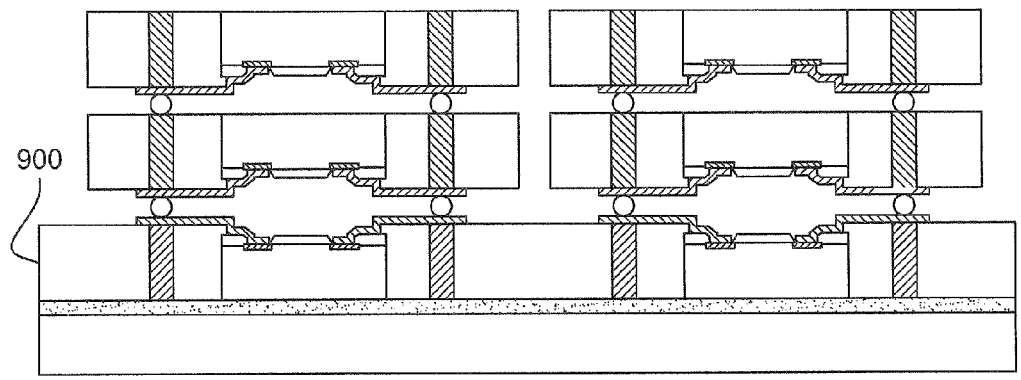
FIG. 9A depicts a further alternate embodiment of a circuit structure, or electronic module, wherein multiple stacks of multiple chips-first layers are disposed over a base chips-first layer, which is shown disposed on a temporary process carrier, and wherein electrical connection to/from each stack of chips-first layers is (for example) via input/output interconnect structures connecting the metallization layer of the top most, inverted chips-first layer of the stack to the metallization layer of the base chips-first layer (supported by the temporary process carrier), in accordance with an aspect of the present invention.
Figure 9B:
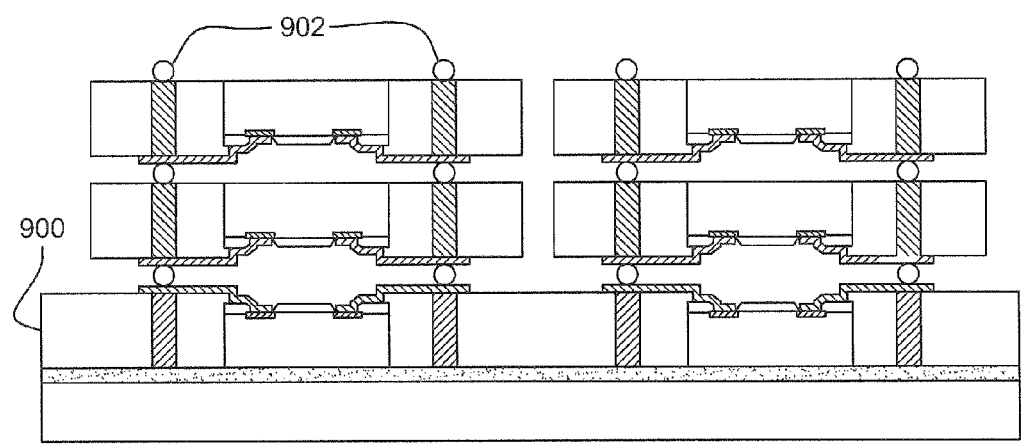
FIG. 9B is a cross-sectional elevational view of the structure of FIG. 9A, after the addition of input/output stack interconnect structures onto the exposed back surfaces of the inverted stacks of multiple chips-first layers, in accordance with an aspect of the present invention.
Figure 9C:
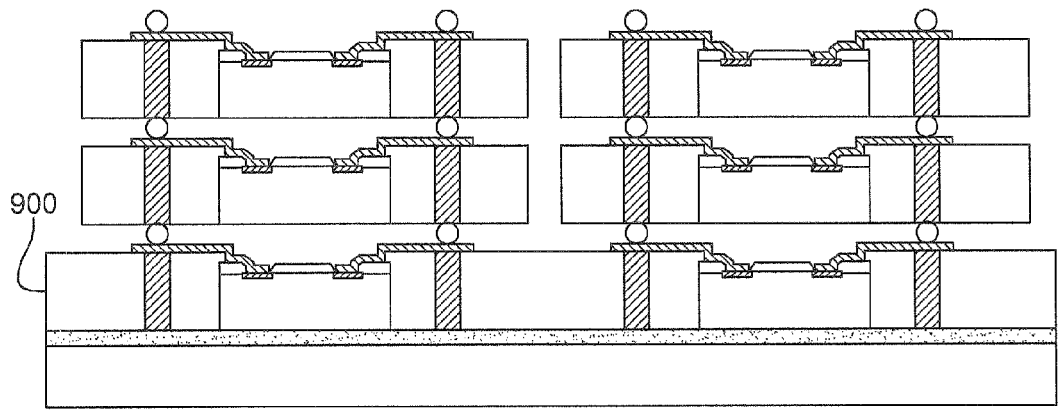
FIG. 9C is a cross-sectional elevational view of an alternate embodiment of a circuit structure, or electronic module, wherein multiple stacks of multiple chips-first layers are disposed over and electrically connected to a base chips-first layer, which is supported by a temporary process carrier, in accordance with an aspect of the present invention.
Figure 9D:
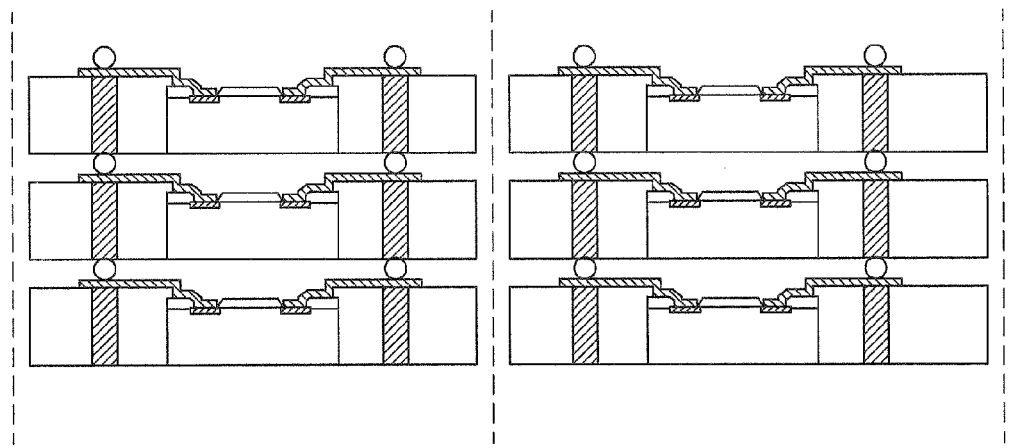
FIG. 9D is a cross-sectional elevational view of the circuit structure of FIG. 9C, after dicing of the base chips-first layer and removal the temporary process carrier, to the form discrete stacks of multiple chips-first layers, in accordance with an aspect of the present invention.

Stacks of Chips-First Layers on Panel of Chips-First Layer:

In this embodiment, a stack of chips-first layers is placed on a base, chips-first panel before the panel is diced into individual structures. FIGS. 9A-9D show the possible processing steps. The chips-first panel layer 900 is processed to the point shown in FIG. 3J, which shows the first level metallization making interconnection to chip contact pads and the through connects. Chips-first structures are then stacked as shown in FIG. 9A, according to the methods described above. FIG. 9B shows the case where the layers face the chips-first panel layer 900. When the stacking is complete, I/O bumps, posts or studs 902 are added to the panel. This may be done by screen printing solder paste and reflowing bumps or by sputtering seed metal, spray coating resist and patterning bumps, posts or studs. It is advantageous to spray coat the resist rather than spin coat since there will be a space between each of the stacked chips-first structures in a given layer. In an alternative embodiment, the base panel is processed to the point shown in FIG. 3K which shows the addition of I/O bumps, posts, or studs. FIG. 9C shows the stacking of modules which have bumps, posts or studs facing away from the chips-first panel layer 900. This approach has the advantage that bumps, posts or studs need not be added after the stacking operations. In either the configuration of FIG. 9B or of FIG. 9C, the panel may be diced and the temporary carrier removed as described above to yield completed stacked packages. Since there is no stiffener or printed circuit board substrate, the resulting package will be of minimal thickness. The use of approaches with underfill or bonding film/epoxy to bond the chips-first structures together, will substantially improve the strength of the resulting stacked package. FIG. 9D shows the individual stacked packages of FIG. 9C, after dicing and removal of the process carrier.

Alternative Carriers

The exemplary embodiments described above assume the use of alignment and process carriers that are rigid. Such carriers may be made, for example, of glass of sufficient thickness to hold the various components flat and in accurate alignment during the processing. It should be understood that flexible or semiflexible process and alignment carriers may also be used. The advantage of a non-rigid carrier is ease of separation during processing. For example, rather than lapping or grinding the glass carrier to remove it, a flexible carrier made of adhesive tape may be removed by a simple peeling operation. In addition, since the glass carrier is ground away it can not be reused and its cost adds to the processing cost of the panel. The cost of glass carriers is low and as disclosed above the grinding operation may be automated to require minimal labor, but the cost of suitable adhesive tape and associated processing cost for its removal is still less than processing with a glass carrier that must be removed by grinding. The major disadvantage of a flexible carrier approach is that alignment between chips during processing is not maintained because the tape is flexible. In addition, the flexible tape can put more stress on the components when they are very thin. As indicated above, the requirement for accurate alignment is reduced when a projection aligner is used since accurate alignment need only be maintained across a single chips-first layer, instead of the entire panel. More specifically, in FIG. 3D an alignment assembly is shown that includes a glass plate 312 with UV opaque mask 314 and a UV release adhesive 318 attaching polyester film 316. If instead, the polyester film 318 were coated with a UV opaque sputtered metal (such as titanium or chrome) and the metal was patterned by applying photoresist and etching the photoresist, a polyester film 316 with UV opaque mask 314 would be formed. Processing using this flexible carrier could then proceed except that the glass carrier would not be present and would therefore not need to be separated from the film 316. Similarly, temporary process carrier 342 with adhesive layer 344 as shown in FIG. 3G could be provided, for example, as a Kapton film with a temporary adhesive such as silicone pressure sensitive adhesive. Such Kapton tapes are well known in the art. This tape could be laminated to form the assembly shown in FIG. 3F and to form the assembly shown in FIG. 3H. Similarly, temporary carrier 504 with adhesive 506 (shown in FIG. 5B) could be a Kapton tape.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the spirit of the invention, and these are therefore considered to be within the scope of the invention as defined in the following claims.

What is claimed is:

1. A circuit structure comprising:
   at least one chips-first layer, each chips-first layer including:
      at least one chip, each chip comprising at least one side surface, an upper surface, a lower surface, and at least one contact pad at the upper surface, and a pad mask over the upper surface with at least one opening therein exposing the at least one contact pad at the upper surface;
      at least one electrically conductive structure comprising at least one side surface, an upper surface and a lower surface;
      a structural material surrounding the at least one side surface of each chip of the at least one chip of the chips-first layer and surrounding the at least one side surface of each electrically conductive structure of the at least one electrically conductive structure, the structural material having an upper surface substantially coplanar with or parallel to at least one of the upper surface of the at least one chip or the upper surface of the at least one electrically conductive structure, and defining at least a portion of a front surface of the chips-first layer, and a lower surface substantially coplanar with or parallel to at least one of a lower surface of the at least one chip or a lower surface of the at least one electrically conductive structure, and defining at least a portion of a back surface of the chips-first layer, and wherein the structural material comprises a dielectric material, and a majority of the pad mask of the at least one chip of the chips-first layer is uncovered by the structural material;
      a metallization layer at the front surface of the chips-first layer, the metallization layer residing at least partially on the upper surface of the structural material and at least partially on the pad mask of the at least one chip, and extending over at least one edge of the at least one chip, and wherein the metallization layer electrically connects the at least one contact pad on the upper surface of the at least one chip to the at least one electrically conductive structure, and the structural material and the pad mask over the upper surface of the at least one chip electrically isolate the metallization layer from the at least one edge of the at least one chip; and
   at least one input/output interconnect structure disposed over the back surface of the at least one chips-first layer, the at least one input/output interconnect structure physically and electrically contacting the lower surface of at least one electrically conductive structure and facilitating electrical connection from the back surface of the at least one chips-first layer to the metallization layer at the front surface of the at least one chips-first layer.

2. The circuit structure of claim 1, wherein the structural material of a chips-first layer of the at least one chips-first layer extends to a height above the pad mask on a chip of that chips-first layer.

3. The circuit structure of claim 1, wherein the structural material of a chips-first layer of the at least one chips-first layer extends over a portion of the pad mask of the at least one chip at the at least one edge thereof.

4. The circuit structure of claim 1, wherein the at least one chip of a chips-first layer comprises multiple contact pads at the upper surface thereof, and wherein the metallization layer of that chips-first layer electrically connects to the multiple contact pads at the upper surface of the at least one chip.

5. The circuit structure of claim 4, wherein the metallization layer of the chips-first layer comprises a patterned metal interconnect that is narrower in width than a width of a contact pad of the multiple contact pads at the point of electrical connection thereto.

6. The circuit structure of claim 1, wherein the at least one electrically conductive structure of a chips-first layer of the at least one chips-first layer is fabricated at least partially of solder.

7. A circuit structure comprising:
a stack of multiple chips-first layers, each chips-first layer in the stack of multiple chips-first layers comprising:
at least one chip, each chip comprising at least one side surface, an upper surface, a lower surface, and at least one contact pad at the upper surface, and a pad mask over the upper surface with at least one opening therein exposing the at least one contact pad at the upper surface;
at least one electrically conductive structure comprising at least one side surface, an upper surface, and a lower surface;
a structural material surrounding the at least one side surface of each chip of the at least one chip of the chips-first layer and surrounding the at least one side surface of each electrically conductive structure of the at least one electrically conductive structure of the chips-first layer, the structural material having an upper surface substantially coplanar with or parallel to at least one of the upper surface of the at least one chip or the upper surface of the at least one electrically conductive structure, and defining at least a portion of a front surface of the chips-first layer, and a lower surface substantially coplanar with or parallel to at least one of the lower surface of the at least one chip or the lower surface of the at least one electrically conductive structure, and defining at least a portion of a back surface of the chips-first layer, wherein the structural material comprises a dielectric material, and a majority of the pad mask of the at least one chip of the chips-first layer is uncovered by the structural material;
a metallization layer residing at least partially on the upper surface of the structural material and at least partially on the pad mask of the at least one chip, and extending over at least one edge of the least one chip, and wherein the metallization layer electrically connects the at least one contact pad on the upper surface of the at least one chip to the at least one electrically conductive structure, and the structural material and the pad mask over the upper surface of the at least one chip electrically isolate the metallization layer from the at least one edge of the at least one chip; and
a plurality of input/output interconnect structures comprising input/output interconnect structures electrically connecting together a first chips-first layer and a second chips-first layer of the stack of multiple chips-first layers, the input/output interconnect structures being disposed between and electrically interconnecting at least one of the lower surface of an electrically conductive structure of the first chips-first layer and the metallization layer of the second chips-first layer, or the metallization layer of the first chips-first layer and the metallization layer of the second chips-first layer, or the lower surface of an electrically conductive structure of the first chips-first layer and the lower surface of an electrically conductive structure of the second chips-first layer.

8. The circuit structure of claim 7, wherein the plurality of input/output interconnect structures are fabricated of solder.

9. The circuit structure of claim 7, wherein the plurality of input/output interconnect structures comprise at least one of a conductive polymer or an anisotropic conductive polymer.

10. A circuit structure comprising:
a stack of multiple chips-first layers, each chips-first layer in the stack of multiple chips-first layers comprising:
at least one chip, each chip comprising at least one side surface, an upper surface, a lower surface, and at least one contact pad at the upper surface, and a pad mask over the upper surface with at least one opening therein exposing the at least one contact pad at the upper surface;
at least one electrically conductive structure comprising at least one side surface, an upper surface, and a lower surface;
a structural material surrounding the at least one side surface of each chip of the at least one chip of the chips-first layer and surrounding the at least one side surface of each electrically conductive structure of the at least one electrically conductive structure of the chips-first layer, the structural material having an upper surface substantially coplanar with or parallel to at least one of the upper surface of the at least one chip or the upper surface of the at least one electrically conductive structure, and defining at least a portion of a front surface of the chips-first layer, and a lower surface substantially coplanar with or parallel to at least one of the lower surface of the at least one chip or the lower surface of the at least one electrically conductive structure, and defining at least a portion of a back surface of the chips-first layer, wherein the structural material comprises a dielectric material;
a metallization layer residing at least partially on the upper surface of the structural material and at least partially on the pad mask of the at least one chip, and extending over at least one edge of the least one chip, and wherein the metallization layer electrically connects the at least one contact pad on the upper surface of the at least one chip to the at least one electrically conductive structure, and the structural material and the pad mask over the upper surface of the at least one chip electrically isolate the metallization layer from the at least one edge of the at least one chip; and
a plurality of input/output interconnect structures comprising input/output interconnect structures electrically connecting together a first chips-first layer and a second chips-first layer of the stack of multiple chips-first layers, the input/output interconnect structures being disposed between and electrically interconnecting at least one of the lower surface of an electrically conductive structure of the first chips-first layer and the metallization layer of the second chips-first layer, or the metallization layer of the first chips-first layer and the metallization layer of the second chips-first layer, or the lower surface of an electrically conductive structure of the first chips-first layer and the lower surface of an electrically conductive structure of the second chips-first layer; and wherein the input/output interconnect structures are disposed between and electrically connect together at least one of the lower surface of an electrically conductive structure of the first chips-first layer and the metallization layer of the second chips-first layer, or the lower surface of an electrically conductive structure of the first chips-first layer and the lower surface of an electrically conductive structure of the second chips-first layer, and wherein the at least one electrically conductive structure of the first chips-first layer comprises solder, and the input/output interconnect structures are fabricated of a material having a melting point higher than the solder of the at least one electrically conductive structure, and project at least partially into the electrically conductive structure of the first chips-first layer.

11. The circuit structure of claim 10, wherein the input/output interconnect structures comprise copper.

12. The circuit structure of claim 7, wherein the stack of multiple chips-first layers is electrically connected to electrical interconnect of a substrate layer.

13. The circuit structure of claim 12, wherein the plurality of input/output interconnect structures are a first plurality of input/output interconnect structures and wherein the substrate layer further comprises a second plurality of input/output interconnect structures, the second plurality of input/output interconnect structures having a different interconnect pitch than the first plurality of input/output interconnect structures.

14. The circuit structure of claim 12, wherein the multiple chips-first layers of the stack of multiple chips-first layers comprise memory chips, and wherein the substrate layer comprises at least one of a memory controller chip or a processor chip electrically connected to the stack of multiple memory chips.

15. The circuit structure of claim 7, wherein the plurality of input/output interconnect structures comprise a first plurality of input/output interconnect structures interconnecting at least two chips-first layers of the stack of multiple chips-first layers, and wherein the circuit structure further comprises a second plurality of input/output interconnect structures associated with the stack of multiple chips-first layers and providing electrical input/output connection to the stack of multiple chips-first layers.

16. The circuit structure of claim 7, further comprising an encapsulant material surrounding the multiple chips-first layers of the stack of multiple chips-first layers.

17. The circuit structure of claim 16, further comprising a stiffener layer physically coupled to the stack of multiple chips-first layers, the stiffener layer comprising a material different from the encapsulant material, and providing rigidity to the circuit structure.

* * * * *